United States Patent [19]

Arbeiter et al.

[11] Patent Number: 5,355,328

[45] Date of Patent: Oct. 11, 1994

[54] RESAMPLING APPARATUS SUITABLE FOR RESIZING A VIDEO IMAGE

[75] Inventors: James H. Arbeiter, Hopewell; Roger F. Bessler, Lawrenceville, both of N.J.

[73] Assignee: NorthShore Laboratories, Inc., Princeton, N.J.

[21] Appl. No.: 33,503

[22] Filed: Mar. 18, 1993

Related U.S. Application Data

[63] Continuation-in-part of Ser. No. 766,128, Sep. 27, 1991, abandoned.

[51] Int. Cl.$^5$ .................... G06F 15/31; H04N 5/14
[52] U.S. Cl. ...................... 364/724.1; 364/724.16; 348/399; 348/440; 348/445
[58] Field of Search ........... 364/724.1, 724.01, 724.05, 364/724.08, 724.11, 724.16; 358/138, 160, 180, 451; 382/47

[56] References Cited

U.S. PATENT DOCUMENTS

| | | | |
|---|---|---|---|
| 4,020,332 | 4/1977 | Crochiere et al. | 364/724.1 |
| 4,282,546 | 8/1981 | Reitmeier | 358/22 |
| 4,472,785 | 9/1984 | Kasuga | 364/724.1 |
| 4,602,285 | 7/1986 | Beaulier | 358/160 |
| 4,682,301 | 7/1987 | Horiba et al. | 364/724.05 |
| 4,779,217 | 10/1988 | Takeda et al. | 364/724.16 |
| 4,821,223 | 4/1989 | David | 364/724.05 |

*Primary Examiner*—David H. Malzahn
*Attorney, Agent, or Firm*—George J. Seligsohn

[57] ABSTRACT

A digital resampler comprises a combination of first means and second means. The first means, which includes interpolation filter means, is responsive to the digital-signal sample values of an input sample stream for producing a first derived sample stream of digital-signal sample values in which the given sampling period P of the input stream is multiplied directly by a factor equal to M'/CL, where C is a given positive integer and M' is smaller than CL, either $2^n(M'/CL)$ or $2^{-n}(M'/CL)$ is equal to M/L and the absolute value of n is at least equal to zero, so that the sampling period of the first derived sample stream is (M'/CL)P. The second means, which includes octave prefiltering and sample means, is responsive to the first derived sample stream of digital-signal sample values for producing as an output a second derived sample stream of digital-signal sample values in which the first derived sampling period (M'/CL)P of the first derived sample stream is multiplied by a factor equal to either $2^n(M'/CL)$ or $2^{-n}(M'/CL)$, so that the sampling period of the second derived sample stream is (M/L)P.

22 Claims, 9 Drawing Sheets

RESAMPLING APPARATUS SUITABLE FOR RESIZING A VIDEO IMAGE

This application is a continuation-in-part application of prior application Ser. No. 07/766,128, filed on Sep. 27, 1991, now abandoned.

BACKGROUND OF THE INVENTION

1. Field of the Invention

The present invention relates to apparatus for resampling given information originally defined by a first series of input samples to derive a second series of output samples defining the same given information, wherein the ratio of the number of input samples of the first series to the number of output samples of the second series may be either less than or greater than unity, and, more particularly, to such apparatus suitable for use in the resizing of a video image.

2. Description of the Prior Art

For such purposes as workstation video processing, scan conversion, and scanner document preparation by means of an image scanner, it is often desirable to resample an input stream of digital-signal sample values by a predetermined improper fractional amount, in the case of signal reduction, or a predetermined proper fractional amount, in the case of signal expansion. In this regard, reference is made to the respective teachings of U.S. Pat. Nos. 4,282,546, 4,602,285 and 4,682,301.

As known in the art, the sampling of an input stream of digital-signal sample values can be altered by the fractional amount M/L by first upsampling the digital-signal sample values by a factor of L and then downsampling the upsampled digital-signal sample values by a factor of M. In order to accomplish this, relatively complex filter means, employing digital interpolation filtering subsequent to upsampling and digital low-pass prefiltering prior to downsampling, is required.

In the case of signal expansion, where M is smaller than L, there is no problem of unwanted aliasing frequencies being created by the upsampling-downsampling processing. However, in the case of signal reduction, where M is larger than L, there is a problem of unwanted aliasing frequencies being created. In order to overcome this problem, the interpolated upsampled signal must be sufficiently bandlimited by the prefiltering to prevent downsampling by an M larger than L causing aliasing. Further, the greater the amount of downsampling (i.e., the larger M is), the larger the number of kernel-function taps is required of the digital low-pass prefilter (i.e., the prefiltering must extend over many samples), thus dictating the use of a long filter response. The cost of a long filter response is added filter complexity and ultimately, silicon real estate when the filter is implemented on a VLSI chip.

In the past, the approach taken to appropriately bandlimit an image signal prior to resampling, whether upsampling, where the sample density is to be increased, or downsampling, where the sample density is to be decreased, is to prefilter the image with an adaptive 2-dimensional filter whose bandwidth is varied according to the amount of image-size reduction/expansion desired in each of the horizontal (X) dimension and vertical (Y) dimension of the image. Two types of digital filters can be used for this purpose: 1) Finite Impulse Response (FIR), or 2) Infinite Impulse Response (IIR).

FIR filters are desirable because they are guaranteed to be stable and can have linear phase—an important property in image processing. However, FIR filters do exhibit extremely long impulse responses (large number of neighborhood samples) for low-frequency filtering. Long impulse responses mean that the tails of the filters (the weighing coefficients furthest from the center filter point) have extremely small coefficients, which means that high arithmetic precision must be used. Also, long filter responses translate into many lines of data storage if used for vertical or Y-directional filtering. Both conditions of high arithmetic precision and many storage elements implies too much hardware, and thus silicon, if integrated onto an integrated circuit.

IIR filters, on the other hand, can have relatively short responses for the equivalent bandreject capability. Unfortunately, IIR filters also can be unstable and demand the use of very high arithmetic precision in computation. Also, IIR filters almost never have linear phase. One known image resizing architecture uses an IIR filter approach. Filter coefficients are updated as a function of the resizing parameter specified. This architecture requires wide dynamic range in its arithmetic in order to guarantee a stable filter for all cases. This structure also does not exhibit good bandwidth limiting for large resampling factors. This design is, therefore, not economical for silicon integration.

Except for their longer filter response, FIR filters are to be favored because they are well behaved, stable, and have linear phase. At lower spatial frequencies, the longer filter response of FIR filters presents a problem in implementation in the prior art. However, the present invention overcomes this problem.

SUMMARY OF THE INVENTION

The present invention is directed to an improvement in apparatus for altering the sampling period of an input stream of digital-signal sample values that define D dimensional information, where D is at least one; wherein those digital-signal sample values of the input stream that define a given dimension of the information occur at a given sampling period P. The apparatus alters the given sampling period P by a factor equal to M/L, where L is a first positive integer greater in value than one and M is a second positive integer.

The improvement comprises a combination of first means and second means.

The first means, which includes interpolation filter means, is responsive to the digital-signal sample values of the input sample stream for producing a first derived sample stream of digital-signal sample values in which the given sampling period P of the input stream is multiplied directly by a factor equal to M'/CL, where C is a given positive integer and M' is smaller than CL, either $2^n(M'/CL)$ or $2^{-n}(M'/CL)$ is equal to M/L and the absolute value of n is at least equal to zero, so that the sampling period of the first derived sample stream is (M'/CL)P.

The second means, which includes octave prefiltering and sample means, is responsive to the first derived sample stream of digital-signal sample values for producing as an output a second derived sample stream of digital-signal sample values in which the first derived sampling period (M'/CL)P of the first derived sample stream is multiplied by a factor equal to either $2^n(M'/CL)$ or $2^{-n}(M'/CL)$, so that the sampling period of the second derived sample stream is (M/L)P.

DESCRIPTION OF THE PREFERRED EMBODIMENTS

Figure 1:
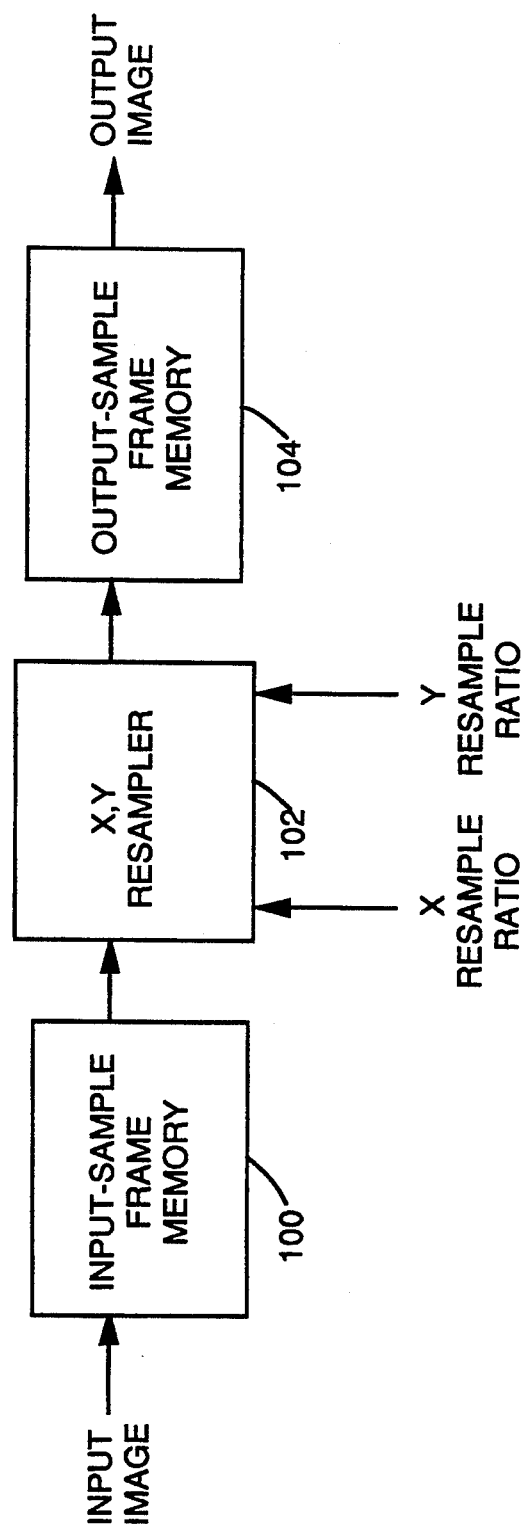
FIG. 1 is a functional block diagram illustrating the resizing of a 2-dimensional input image by means of a 2-dimensional resampler.

In digital image processing, it is often desirable to resize an original video image. For instance, in combining a plurality of separate input video images into a single output video image, the size of at least one of the input video images needs to be reduced. On the other hand, the size of a small portion of an input video image can be enlarged in the output video image up to the entire size of the input video image. Usually, resizing does not involve any change in aspect ratio. However, resizing may be used to change aspect ratio for special effect purposes. FIG. 1 is directed to a digital image processor for resizing an input video image.

Referring to FIG. 1, there is shown input-sample frame (or field) memory 100 for storing an input stream of digital-signal sample values written into thereto that define a 2-dimensional input video image, such as a television frame. As known, a temporal video signal forms a video image comprising a plurality of scan lines arranged in the vertical or Y-direction, with each scan-line comprising a plurality of pixels arranged in the horizontal or X-direction. It is assumed that the video signal has been sampled at a predetermined sampling period and converted from analog to digital form to provide the input stream of digital-signal sample values stored in input-sample frame memory 100. Both the input stream of digital-signal sample values comprising the video signal defining the input video image applied to input-sample frame memory 100 and the stream of digital-signal sample values read out therefrom may be either in interlaced-scan form (e.g., an NTSC video signal) or in progressive-scan form. Further, input-sample frame memory 100, if desired, may include means for converting an interlaced-scan input to a progressive-scan prior to the readout of successive samples from input-sample frame memory 100 and their translation through X,Y resampler 102.

In principle, the readout of successive samples from input-sample frame memory 100 and their translation through X,Y resampler 102 may be either synchronous or asynchronous. However, for illustrative purposes, synchronous operation at a predetermined clock period is assumed. In this case, while the pixel sampling period, in the X-direction of the video image, of samples read out from input-sample frame memory 100 is the aforesaid predetermined clock period, the sampling period in the Y-direction of the video image is an entire scanline period (with each scanline including a large number of pixel sample values).

In order to change the size of a video image originally having a first given size to a second given size, it is necessary to independently change the sampling period in the X-direction (i.e., the pixel sampling period) and/or the sampling period in the Y-direction (i.e., the scanline sampling period). This is accomplished by X,Y resampler 102 in accordance with X and Y resample ratio control signals applied thereto, as shown. Thus, the respective pixel sampling period in the X-direction and scanline sampling period in the Y-direction of the output stream of digital-signal sample values from X,Y resampler 102, which are applied as an input to output-sample frame memory 104, are different from the respective pixel sampling and scanline sampling periods of the stream of digital-signal sample values from input-sample frame memory 100 applied as an input to X,Y resampler 102. However, from a timing point of view, it is assumed for illustrative purposes that the same predetermined clock period is employed for controlling the reading out of samples from input-sample frame memory 100, the resampling by X,Y resampler 102, and the writing in of samples to output-sample frame memory 104. In other words, it is assumed for illustrative purposes that X,Y resampler 102 employs pipeline architecture to process a stream of samples translated therethrough. The respective clock periods of the input stream of samples of the input image written into input-sample frame memory 100 and the output stream of samples of the output image read out from output-sample frame memory 104 may be the same as or different from the predetermined clock period or the same as or different from one another.

Reduction in the X size of an image causes there to be fewer pixel samples in each scanline of the resampled reduced image than the number of pixel samples in each scanline of of the original image stored in input-sample frame memory 100. Similarly, reduction in the Y size of an image causes there to be fewer scanlines of pixel samples in the resampled reduced image than the number of scanlines of pixel samples in the original image stored in input-sample frame memory 100. Thus, in the case of image size reduction, X,Y resampler 102 between its input and output performs of a sample-decreasing function.

However, expansion in the X size of an image causes there to be more pixel samples in each scanline of the resampled expanded image than the number of pixel samples in each scanline of of the original image stored in input-sample frame memory 100, and expansion in the Y size of an image causes there to be more scanlines of pixel samples in the resampled expanded image than the number of scanlines of pixel samples in the original image stored in input-sample frame memory 100. Thus, X,Y resampler 102, between its input and output, performs of a sample-decreasing function in the case of image size reduction, and performs of a sample-increasing function in the case of image size expansion.

X,Y resampler 102 has available to it for sample-processing and computation purposes all of the pixel sample values stored in input-sample frame memory 100. Further, X,Y resampler 102 itself includes appropriate registers for temporarily holding computed sample values during processing. For illustrative purposes, it is assumed in FIGS. 2, 3 and 3a, described below, that all processing by X,Y resampler 102 takes place serially in pipeline fashion at a single clock rate. However, it should be understood that, in practice, processing of pixel samples by X,Y resampler 102 may take place in parallel and/or at more than one clock rate.

Figure 2:
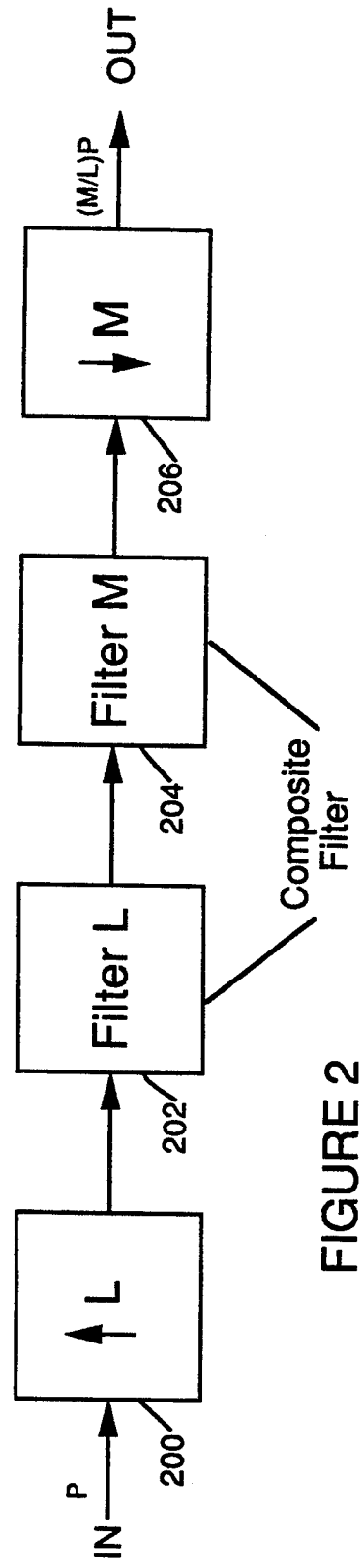
FIG. 2 is a functional block diagram illustrating a prior-art approach for resampling the sampling period P of an input stream of digital-signal sample values that define a given dimension of information, where the given dimension may be either the horizontal or, alternatively, the vertical dimension of a video image.

FIG. 2 is a functional block diagram illustrating the approach employed by the resampler of the prior-art for altering either the pixel sampling period in the X-direction in accordance with the X resample ratio or, alternatively, the scanline sampling period in the Y-direction in accordance with the Y resample ratio. Specifically, it is assumed that the input sampling period P is to be altered by a factor K equal to M/L, where M/L may be either a proper fraction (M being a positive integer smaller than a positive integer L) or an improper fraction (M being larger than L). In the resizing of a video image by expanding a smaller sized image into a larger sized image, M/L is a proper fraction, while in the resizing of a video image by reducing a larger sized image into a smaller sized image, M/L is an improper fraction.

As indicated by block 200, the input is first upsampled by the factor L. By way of example, this can be accomplished by inserting (L−1) zero-valued samples between each pair of consecutive input sample values. Filter L (202) is an adaptable digital filter effective in substituting an appropriately interpolated value of that pair of consecutive input sample values for each of the (L−1) zero-valued samples. It should be understood that no additional information is gained by this upsampling process, since the only available source of information is contained in the input stream of sample values. Thus, the upsampling merely results in oversampling.

Filter M (204) is an adaptable digital bandlimiting prefilter having a cutoff that substantially rejects all baseband frequency components having frequency periods less than one-half the output sampling period (M/L)P. The output from filter M (204) is then downsampled by a factor M, as indicated by block 206, to derive an output stream of samples having an output sampling period (M/L)P. In practice, the separate functions performed by filter L and filter M may be combined into a single composite filter structure, as indicated in FIG. 2.

If the resampler were limited to the case in which M<L, the downsampling of the upsampled stream could be done directly, without need for filter M (204), because, in this case, the output downsampled stream sample density is greater than that of the input upsampled stream. Therefore, no information defined by the input upsampled sample values can be lost and no aliasing can occur. However, the resampler must also be able to take care of the case in which M>L, wherein the output downsampled stream sample density is smaller than that of the input upsampled stream, resulting in undersampling of the output downsampled stream. In this latter case information defined by one or more input sample values can be lost and aliasing can occur. Therefore, filter M must be designed to minimize aliasing under the largest ratio of M/L that resampler 102 can handle. This requires relatively complex and costly M filters in order to ensure that substantially all baseband frequency components having frequency periods less than one-half the output sampling period (M/L)P are removed in all cases before downsampling by M. In addition, the transfer characteristic of the M filter should be designed to introduce substantially no phase and other types of distortion in the signal passed therethrough.

Figure 3:
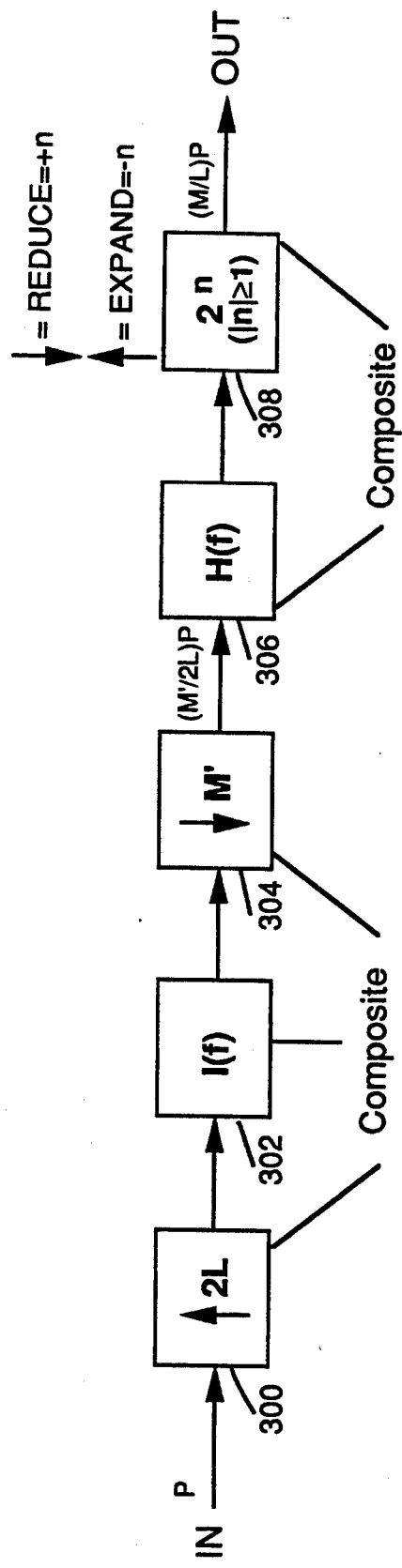
FIG. 3 is a functional block diagram illustrating a first embodiment of the present invention's approach for resampling the sampling period P of an input stream of digital-signal sample values that define a given dimension of information, where the given dimension may be either the horizontal or, alternatively, the vertical dimension of a video image.

FIG. 3 is a functional block diagram illustrating the approach employed by a first embodiment of the resampler of the present invention for altering either the pixel sampling period in the X-direction in accordance with the X resample ratio or, alternatively, the scanline sampling period in the Y-direction in accordance with a Y resample ratio. As in the case of FIG. 2, it is assumed in the first embodiment shown in FIG. 3 that the input sampling period P is to be altered by a factor K equal to M/L, where M/L may be either a proper fraction (M being a positive integer smaller than a positive integer L) for expansion in the X or Y size of an image or an improper fraction (M being larger than L) for reduction in the X or Y size of an image.

As indicated by block 300, interpolator I(f) 302 and block 304 (which, as indicated in FIG. 3, may be implemented, in practice, in composite form), the input is effectively upsampled by the factor 2L with interpolated digital sample values and directly downsampled by the factor M', thereby to produce a first derived sample stream having a period equal to (M'/2L)P. M' is an integer having a value smaller than that of 2L (so that M'/2L is always a proper fraction), in which the value of M' is chosen so that the value of either $2^n(M'/CL)$ or $2^{-n}(M'/CL)$ is equal to the value of M/L.

As in FIG. 2, the input may be first upsampled by the factor 2L by inserting (2L−1) zero-valued samples between each pair of consecutive input sample values (as indicated by block 300) prior to appropriately interpolated values of that pair of consecutive input sample values being substituted for each of the (2L−1) zero-valued samples (as indicated by block 302), and then be downsampled by the factor M' (as indicated by block 304). However, unless the value of the proper fraction M'/2L happens to be a very small fraction, this is an inefficient approach to deriving the factor M'/2L. Specifically, because the downsampling in FIG. 3 is direct (i.e., no prefiltering is required prior to downsampling by the factor M in the resampler approach of the present invention shown in FIG. 3), makes it possible to divide a longer period interval, that is equal in length to M times the input period P, into a series of oversampled periods equal in length to $\frac{1}{2}$L of this longer period and then insert appropriately interpolated values for each oversampled period of this series.

For instance, assume that M=5 and L=4, so that M/L=5/4. Therefore, in this case, M'/2L=$\frac{5}{8}$. Assume further that six successive samples of the input sample stream, occurring with a sample period P have the respective sample values $v_1, v_2, v_3, v_4, v_5$ and $v_6$. In this case, the respective upsampled interpolated sample values, occurring with a sample period 5P/8 (assuming linear interpolation), are $v_1$, $v_1+\frac{5}{8}(v_2-v_1)$, $v_2+\frac{1}{4}(v_3-v_2)$, $v_2+\frac{7}{8}(v_3-v_2)$, $v_3+\frac{1}{2}(v_4-v_3)$, $v_4+\frac{1}{8}(v_5-v_4)$, $v_4+\frac{3}{4}(v_5-v_4)$, $v_5+\frac{3}{8}(v_6-v_5)$ and $v_6$. Thus, this process converts each group of six successive samples of the input sample stream into a group of nine successive interpolated-value samples, which occur serially at the same single clock rate as the group of six successive samples, in accordance with the aforesaid illustrative assumption. However, it should be understood that, in practice, the interpolation function need not be linear.

As discussed above in connection with FIG. 2, it is necessary in the prior-art resampler approach to prefilter before downsampling by M can take place. Therefore, direct downsampling of the upsampled samples is not possible. This means that upsampling in the prior-art resampler approach requires that (L−1) interpolated sample values be inserted between each pair of consecutive sample values of the input sample stream. If L=4, as assumed above, the respective upsampled interpolated sample values in the prior-art resampler approach, occurring with a sample period P/4 (assuming linear interpolation), are $v_1$, $v_1+\frac{1}{4}(v_2-v_1)$, $v_1+\frac{1}{2}(v_2-v_1)$, $v_1+\frac{3}{4}(v_2-v_1)$ and $v_2$.

It is plain from the above discussion that the ability to directly downsample makes it possible to increase the difference between the respective sample values of successive interpolated samples, so long as the value of M is not too much smaller than the value of 2L, which is usually the case in practice. This is a desirable feature of the present invention.

Returning to FIG. 3, the first derived stream of sample values, which have a sample period equal to (M'/2L)P, are prefiltered by digital octave filter H(f) 306 and multiplied by $2^n$ means 308, where n has an absolute value of at least one, thereby producing as an output a second derived stream of sample values having a period equal to (M/L)P. As indicated in FIG. 3, the separate functions performed by digital octave filter H(f) 306 and $2^n$ means 308, in practice, may be combined in a single composite structure. Further, as indicated by the arrows situated above $2^n$ means 308, $2^n$ means 308 performs the function (1) of decreasing (downsampling) the number of samples in the second derived stream of sample values in the case of reduction in the size of an image when n has a positive value, thereby causing the sample period to be increased, and (2) of increasing (upsampling) the number of samples in the second derived stream of sample values in the case of expansion in the size of an image when n has a negative value, thereby causing the sample period to be decreased.

As discussed above, in the first embodiment shown in FIG. 3 the resampling ratio M/L may be either a proper fraction (in the expansion of the size of an image) or may be an improper fraction (in the reduction of the size of an image). Further, in the case of image expansion (M<L), in which the insertion of interpolation coefficients involves oversampling, no problem of aliasing exists. Therefore, it is not necessary to upsample by the factor 2L with interpolated digital sample values before directly downsample by the factor M', as described above in connection with FIG. 3.

The fact is that upsampling by the factor 2L doubles the number of interpolated pixel values that need to be computed and inserted into the data stream during each scanline period, which number may be quite large when the image size defined by a small portion of each successive scanline is expanded to the size of each entire successive scanline. In the case of real-time processing, this creates a practical problem in implementation. One obvious solution is to employ a system clock at twice the frequency so that all required computations can be made within the time span of each successive scanline period. However, this causes additional heating of the circuitry, which is particularly undesirable in a VLSI implementation. Another obvious solution is to employ additional computer elements operating in parallel. However, this increases the cost of implementation.

Figure 3A:
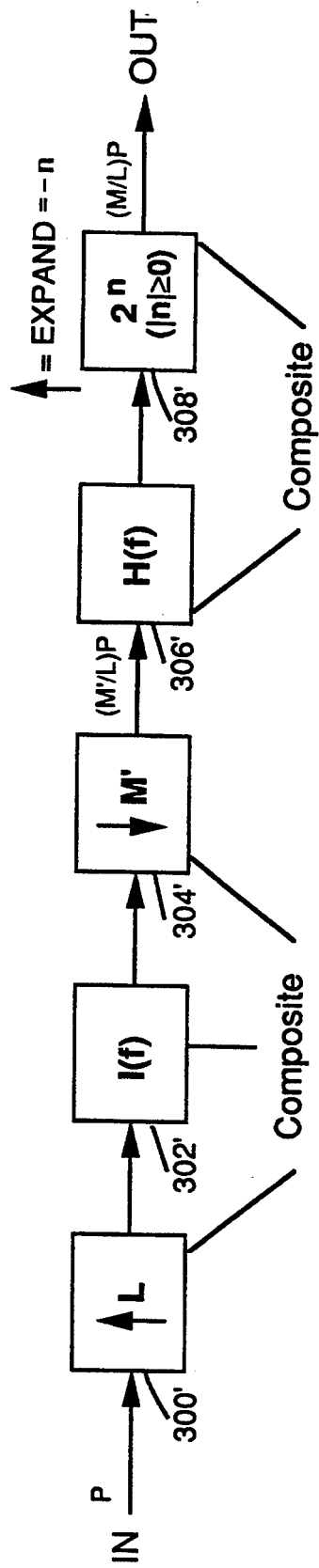
FIG. 3a is a functional block diagram illustrating a second embodiment of the present invention's approach for resampling the sampling period P of an input stream of digital-signal sample values that define a given dimension of information, where the given dimension may be either the horizontal or, alternatively, the vertical dimension of a video image.

Because upsampling by the factor 2L is not required for image size expansion (but only for image size reduction), doubling the number of interpolated pixel values that need to be computed and inserted into the data stream during each scanline period and the real-time processing problem in implementation created thereby is avoided in the expansion case by only upsampling by a factor of L, rather than by a factor of 2L. FIG. 3a is a functional block diagram illustrating the approach employed by a second embodiment of the resampler of the present invention that is limited to the expansion case in which M<L.

As indicated in FIG. 3a by block 300', interpolator I(f) 302' and block 304' (which, as indicated in FIG. 3a, may be implemented, in practice, in composite form), the input is effectively upsampled by the factor L with interpolated digital sample values and directly downsampled by the factor M', thereby to produce a first derived sample stream having a period equal to (M'/L)P. M' is an integer having a value smaller than that of L (so that M'/L is always a proper fraction), in which the value of M' is chosen so that the value of $2^{-n}$(M'/L) is equal to the value of M/L.

More specifically, in FIG. 3a, the first derived stream of sample values, which have a sample period equal to (M'/L)P, are prefiltered by digital octave filter H(f) 306' and multiplied by $2^{-n}$ means 308', where n has an absolute value of at least zero, thereby producing as an output a second derived stream of sample values having a period equal to (M/L)P. As indicated in FIG. 3a, the separate functions performed by digital octave filter H(f) 306 and $2^n$ means 308', in practice, may be combined in a single composite structure. Further, as indicated by the arrow situated above $2^n$ means 308', $2^n$ means 308' performs the function of only increasing (upsampling) the number of samples in the second derived stream of sample values because means 308' is used only in the case of expansion in the size of an image. In this case n always has a negative value.

As known, a digital octave filter is a symmetrical multitap filter having a low-pass kernel weighting function characteristic defined by the respective multiplier coefficient values thereof. In principle, the number of taps of the symmetrical multitap filter may be either odd or even. However, in practice, it is preferred that the multitap filter have an odd number of taps so that the respective multiplier coefficient values can be symmetrically disposed about a central multiplier coefficient value of the' kernel weighting function. It is usual for the value of each multiplier coefficient of a low-pass kernel weighting function to become smaller in accordance with the distance of that multiplier coefficient from the central multiplier coefficient.

For illustrative purposes, it is first assumed that in FIGS. 3 and 3a the symmetrical multitap filter is a 5-tap digital filter having a low-pass kernel weighting function characteristic defined by the five multiplier coefficient values c, b, a, b and c. Generally, in both FIGS. 3 and 3a, these multiplier coefficient values meet both of the two above-described constraints. In order to meet the first constraint, $a+2b+2c=1$. In order to meet the second constraint, $a+2c-2b$. The result is that $b=\frac{1}{4}$ and $a=\frac{1}{2}-2c$. By way of an example if $c=1/16$, $b=\frac{1}{4}$ and $a=\frac{3}{8}$. However, in the special case in which the second embodiment of FIG. 3a is employed to provide an expansion greater than 1 but less than 2 (i.e., $\frac{1}{2}<M/L<1$),—so that the n value of $2^n$ means 308' is zero (i.e., no upsampling is required)—the five multiplier coefficient values c, b, a, b and c have the respective values 0, 0, 1, 0 and 0.

For example, consider the special case in which it is desired to provide an expansion of 1.5 (i.e., $(M/L)P=2^0(M'/L)P=(1*\frac{2}{3})P=2P/3$). In this example, the respective interpolated sample values of the first derived stream of sample values M'/L, occurring with a sample period 2P/3 (assuming linear interpolation), for deriving are $v_1$, $v_1+\frac{2}{3}(v_2-v_1)$, $v_2+\frac{1}{3}(v_3-v_2)$ and $v_3$. This first derived stream of sample values are applied as an input to filter 306', the five multiplier coefficient values of filter 306' are set to have the respective values 0, 0, 1, 0 and 0, and the value n of $2^n$ means 308' is set to 0, so that $2^n=2^0=1$. Therefore, in the special case, the second derived stream of sample values, $(M/L)P$, at the output of means 308', remain the same as the first derived stream of sample values, $(M'/L)P$, at the input of $2^n$ means 308'. Therefore, no multiplication takes place in the special case. Thus, in the above example, in which $(M/L)P=(M'/L)P=2P/3$, image expansion of 1.5 results.

However, in the more general case of performing the function of image expansion by a factor M of more than two (e.g., 3.6 by way of an example), M'/L is made equal to $M/2^nL$ ($3.6/2^1=3.6/2=1.8$ in the above example) and $2^n$ means 308' of FIG. 3a upsamples the first derived stream of sample values by a factor of $2^n$ ($2^1=2$ in the above example). In a similar manner, the first derived stream of sample values M'/2L is upsampled by $2^n$ means 308 of FIG. 3 by a factor of $2^n$ in the case of performing the function of image expansion. However, in the case of performing the function of image reduction, $2^n$ means 308 of FIG. 3 downsamples the first derived stream of sample values M'/2L by a factor of $2^n$.

As described above, the input samples are upsampled by a factor of 2L in the first embodiment shown in FIG. 3 and are upsampled by a factor of L in the second embodiment shown in FIG. 3a. In principle, however, the upsampling in FIG. 3 could be by any factor CL, where C is a given positive integer of at least two, in which case $2^n(M'/CL)$ is equal to M/L and the absolute value of n is at least equal to one. Similarly, the upsampling in FIG. 3a could be by any factor CL, where C is a given positive integer of at least one, in which case $2^n(M'/CL)$ is equal to M/L and the absolute value of n is at least equal to zero. It will be understood that a value for C of two, in the case of FIG. 3, and a value for C of one in the case of FIG. 3a, minimizes the number of interpolated values that need be computed and, therefore, is more efficient than the use of a higher given positive integer for C would be.

Conventional filtering of a stream of digital sample values with a 5-tap digital filter requires delay means that provides a total of 4 sampling periods of delay. This is so because only the fifth-occurring one of five successively-occurring samples of the stream can be operated on by the filter in real time, so that it is necessary to store each of the four preceding ones of five successively-occurring samples in order for all of these five samples to be available for summing concurrently. Thus, assuming filter 306 of FIG. 3 or filter 306' of FIG. 3a to be a conventional 5-tap digital filter, the delay means of filter 306 or 306' must provide a total delay of $(4M'/2L)P$, or $(2M'/L)P$, sampling periods in the case of FIG. 3, and of $(4M'/L)P$ sampling periods in the case of FIG. 3a, where P is the sampling period of the input stream to filter 306 or 306'. In the resizing of a video image, P may represent the relatively short pixel sampling period in the horizontal (X) direction of the video image or, alternatively, the relatively long scanline sampling period in the vertical (Y) direction of the video image.

Figure 4:
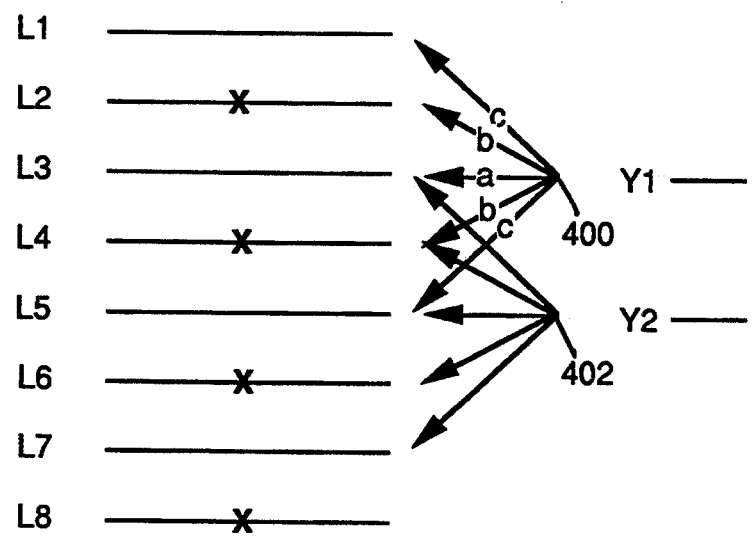
FIG. 4 diagrammatically illustrates the digital prefiltering and downsampling by a factor of 2 of the horizontal or, alternatively, the vertical dimension of a video image by means of a five-tap digital filter.

Referring to FIG. 4, there is shown a known manner by which downsampling by a factor of 2 in the output signal from a 5-tap digital filter is usually achieved. In FIG. 4, it is assumed for illustrative purposes that relatively long scanline sampling periods in the vertical (Y) direction of the video image are being considered. L1, L2 . . . L7 and L8 indicate eight successive relatively long horizontal scan lines of the video image (with each scanline comprising a large number of pixel sample values) defined by the first derived stream of sample values applied as an input to filter 306 of FIG. 3. Since filter 306' of FIG. 3a is used only for upsampling, FIG. 4 does not apply to filter 306'.

In the prior art, the structure of a 5-tap digital filter includes 4 serially-connected delay means, each of which provides 1 scanline period of delay, to which each of successive input scan lines L1, L2 . . . L7 and L8 is applied, in turn, as an input to the first delay line. Each of the 4 delay lines includes a tap at its output and, in addition, the first delay line includes a tap at its input. Each pixel sample value of a line is multiplied by an appropriate one of kernel-function multiplier coefficients c,b,a,b,c either before being applied as an input to the first delay line or, alternatively, after it emerges from each of the five delay line taps. In any case, all of the corresponding pixel sample values of a set of 5 successive scan lines concurrently emerging from the 5 delay-line taps (after each of them has been multiplied by an appropriate one of kernel-function multiplier coefficients c,b,a,b,c) are summed to derive a 5-tap filtered output pixel sample value.

Specifically, in FIG. 4, the filtered output schematically indicated by solid-arrows 400, corresponding to central input line L3 of the filter, represents the sum of each of corresponding pixel sample values of input lines L1 to L5 times its own particular kernel-function multiplier coefficient c,b,a,b,c, shown in FIG. 4. These corresponding pixel sample values of lines L1 to L5 appear at the respective five taps of the 5-tap filter, with L1 having been delayed by 4 scanline periods, L2 having been delayed by 3 scanline periods, L3 having been delayed by 2 scanline periods, L4 having been delayed by 1 scanline period, and L5 being undelayed (i.e., occurring in real time). Two scanline periods later, the filtered output schematically indicated by solid-arrows 402, corresponding to central input line L5 of the filter, represents the sum of each of corresponding pixel sample values of input lines L3 to L7 times its own particular kernel-function multiplier coefficient c,b,a,b,c. At this time, these corresponding pixel sample values of lines L3 to L7 appear at the respective five taps of the 5-tap filter. In a similar manner, respective filtered outputs may be derived corresponding to each successive odd central input line of the filter (e.g., L7, L9, L11 ... ). Downsampling of scan lines by a factor of 2 is achieved by not deriving filtered outputs corresponding to the even central input lines of the filter (e.g., L2, L4, L6, L8 ... ), marked by an "X".

Figure 4A:
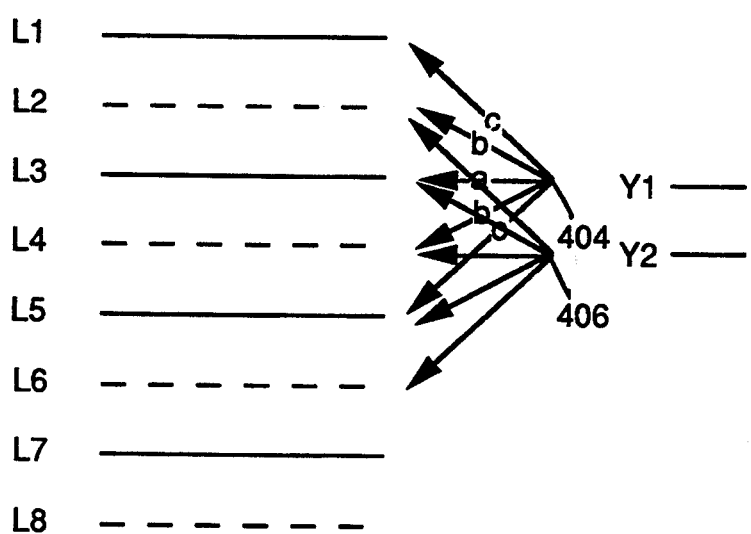
FIG. 4a diagrammatically illustrates the digital prefiltering and upsampling by a factor of 2 of the horizontal or, alternatively, the vertical dimension of a video image by means of a five-tap digital filter.

Referring to FIG. 4a, there is shown a manner by which upsampling by a factor of 2 in the output signal from a 5-tap digital interpolation filter may be achieved by first inserting an additional input line following each original input line and then sequentially applying the input lines to the 5 taps of the digital filter. Each of the additional input lines (e.g., L2, L4, L6 and L8 shown as dashed lines in FIG. 4a) consists solely of zero-valued samples. In FIG. 4a the filtered output schematically indicated by solid-arrows 404, corresponding to central input line L3 of the filter, represents the sum of each of corresponding pixel sample values of input lines L1 to L5 times its own particular kernel-function multiplier coefficient c,b,a,b,c. Since all the sample values of input lines L2 and L4 are zero, the filtered output corresponding to central input line L3 of the filter, represents the sum of each of corresponding pixel sample values of only input lines L1, L3 and L5 times its own particular kernel-function multiplier coefficient c,a,c. Further, the filtered output schematically indicated by solid-arrows 406, corresponding to central input line L4 of the filter, represents the sum of each of corresponding pixel sample values of input lines L2 to L6 times its own particular kernel-function multiplier coefficient c,b,a,b,c. Since all the sample values of input lines L2, L4 and L6 are zero, the filtered output corresponding to central input line L4 of the filter, represents the sum of each of corresponding pixel sample values of only input lines L3 and L5 times its own particular kernel-function multiplier coefficient b,b. Generalizing, only kernel-function multiplier coefficients c,a,c are employed in computing the filtered output value corresponding to each odd central input line higher than L3, and only kernel-function multiplier coefficients b,b are employed in computing the filtered output value corresponding to each even central input line higher than L4.

The problem with the prior-art structure discussed above in connection with FIGS. 4 and 4a is that it requires a large number (i.e., a total of at least four) relatively long scanline period delay means to provide an octave prefilter with a downsampling of 2, with effective 5-tap filter integration of input sample values in each output sample value. In order to accomplish a downsampling or upsampling of 4 or 8 (i.e., a larger power of 2), one can either cascade several such downsampling or upsampling-of-2 structures or, alternatively, employ an octave prefilter with a much larger number of taps. In either case, the number of required relatively long scanline period delay means increases rapidly.

The present invention, in part, is directed to octave prefilter structures, which, like the prior-art approach discussed above, are capable of effective 5-tap filter integration of input sample values in each output sample value, but which requires only two scanline period delay means to provide multiplication by $2^n$, for downsampling, or $2^{-n}$, for upsampling, regardless of the value of n. Thus, n in FIG. 3 may be 1, 2, 3, or even higher to provide multiplication by 2, 4, 8, or even higher for downsampling, and in FIG. 3a may be $-1$, $-2$, $-3$, or even lower to provide multiplication by $\frac{1}{2}$, $\frac{1}{4}$, $\frac{1}{8}$, or even lower for upsampling. The octave prefilter structures of the present invention make it possible to implement a resampler of the type disclosed in FIG. 3 or 3a, such as a video-image resizer, on a VLSI chip.

Figure 5A:
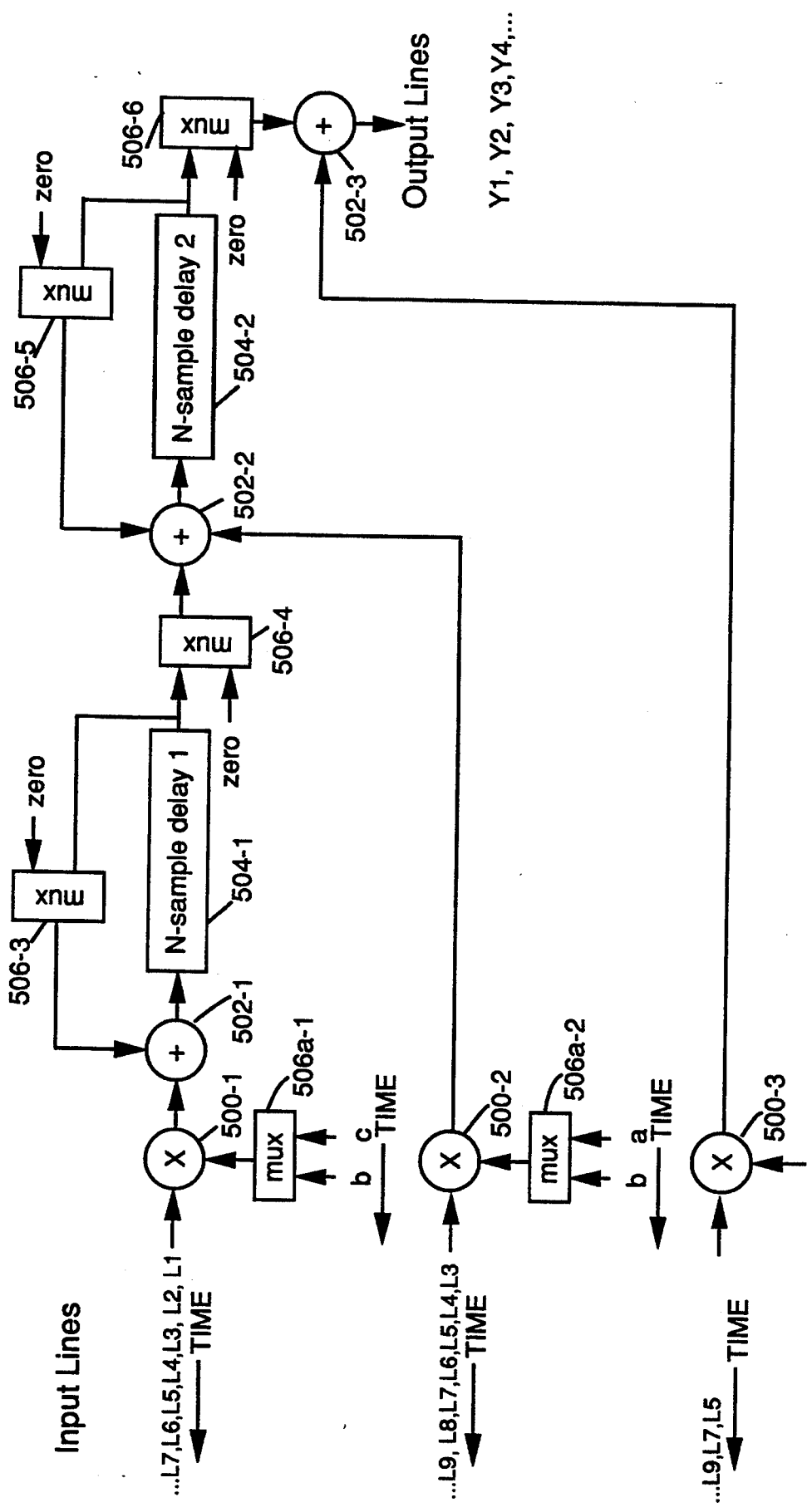
FIG. 5a is a block diagram of a first implementation of a five-tap octave digital filter providing a multiplication by a factor of 2 in the vertical dimension of a video image, which first implementation is suitable for realization on a VLSI chip.

Referring now to FIG. 5a, there is shown a first 5-tap octave prefilter structure of the present invention which is capable in a first mode of operation of providing downsampling by a factor of 2, in a second mode of operation of providing upsampling by a factor of 2, and in a third mode of operation of being transparent by providing a factor of 1 between its inputs and output. This octave prefilter structure, which derives a single output stream of sample values derived from three separate input streams of sample values, comprises the three multipliers 500-1, 500-2 and 500-3; the three summers 502-1, 502-2, and 502-3; the two N-sample delay means 504-1 and 504-2; and the six 2-input multiplexers (mux) 506a-1, 506a-2, 506-3, 506-4, 506-5 and 506-6. FIG. 5a specifically shows the 5-tap octave prefilter structure thereof operating in its first (downsampling) mode. However, as will be described later below, by modifying the inputs thereto and the timing control thereof, the same 5-tap octave prefilter structure of FIG. 5a may be operated in its second (upsampling) mode or in its third (transparent) mode.

As indicated in FIG. 5a, starting with input line L1, multiplier 500-1 receives, in turn, as a multiplicand each of all the successive input lines L1, L2 ... L6, L7 ... of sample values, and receives as a multiplier the mux 506a-1 input kernel-function coefficient c or b then appearing at the output of mux 506a-1. Starting with input line L3, multiplier 500-2 receives, in turn, as a multiplicand each of all the successive input lines L3, L4 ... L8, L9 ... of sample values, and receives as a multiplier the mux 506a-2 input kernel-function coefficient a or b then appearing at the output of mux 506a-2. Starting with input line L5, multiplier 500-1 receives, in turn, as a multiplicand each of all the successive odd-numbered input lines L5, L7, L9 ... of sample values, and receives as a multiplier the kernel-function coefficient c. In general, each of the successive input lines L1 .

... L9 ... comprises N sample values, where N may be any positive integer. However, for illustrative purposes, it is assumed that each of these successive input lines is a scanline of a video image, occupying a scanline period, and N is the number of pixel sample values in such a scanline period.

The output of multiplier 500-1 is applied as a first input to summer 502-1 and the output of summer 502-1 is applied as an input to first N-sample delay means 504-1. The output of first N-sample delay means 504-1 is applied both as a first input to mux 506-3 and as a first input to mux 506-4. A zero value is applied as a second input to both mux 506-3 and mux 506-4. The output of mux 506-3 is applied as a second input to summer 502-1 and the output of mux 506-4 is applied as a first input to summer 502-2. The output from multiplier 500-2 is applied as a second input to summer 502-2 and the output from summer 502-2 is applied as an input to second N-sample delay means 504-2. The output from second N-sample delay means 504-2 is applied both as a first input to mux 506-5 and as a first input to mux 506-6. A zero value is applied as a second input to both mux 506-5 and mux 506-6. The output from mux 506-5 is applied as a third input to summer 502-2 and the output from mux 506-6 is applied as a first input to summer 502-3. The output from multiplier 500-3 is applied as a second input to summer 502-3 and the output from summer 502-3 comprises the output lines Y1, Y2, Y3, Y4 ... derived by the first 5-tap octave prefilter structure of the present invention, shown in FIG. 5a.

In addition to the structure shown in FIG. 5a, in practice, each multiplier and summer includes an individual sample latch (not shown) at each of its inputs and at its output, with each latch introducing a one sample delay in the flow of data. Further, in practice, suitable timing and control circuitry (not shown) is provided for controlling the flow of data through the octave prefilter structure shown in FIG. 5a. The flow of this data through the octave prefilter structure shown in FIG. 5a will now be discussed.

All the 2-input mux switch back and forth between their 2 inputs at the end of each scanline period. The initial setting of mux 506a-1 is such that it is in its c-coefficient input state during the occurrence of each odd input line, starting with input line L1, and the initial setting of mux 506a-2 is such that it is in its a-coefficient input state during the occurrence of each odd input line, starting with input line L3. The settings of mux 506-3 and 506-5 are such that the respective outputs of first and second N-sample delay means 504-1 and 504-2 are recirculated only during even input-line scanline period cycles of operation and zero values are normally recirculated during all odd input-line scanline period cycles of operation (although, in principle, it is not absolutely essential that mux 506-3 and 506-5 be in their zero value state during those odd input-line scanline period cycles of operation—such as during the 1st cycle—where it is known a priori that no sample values can be emerging from the respective outputs of first and second N-sample delay means 504-1 and 504-2). The settings of mux 506-4 and 506-6 are such that the respective outputs of first and second N-sample delay means 504-1 and 504-2 are translated therethrough to the first input of respective summers 502-2 and 502-3 only during odd input-line scanline period cycles of operation and zero values are translated therethrough to the first input of respective summers 502-2 and 502-3 during even input-line scanline period cycles of operation.

For purposes of the following discussion, corresponding sample values of the respective input lines L1, L2, L3 ... are designated $v_{L1}$, $v_{L2}$, $v_{L3}$ ..., respectively.

During the 1st scanline period cycle of operation of the filter, only each of the N samples of input line L1 is first multiplied by the c-coefficient, to provide a sample value $cv_{L1}$ and then each of these $cv_{L1}$ valued N samples is applied through summer 502-1 as an input to first N-sample delay means 504-1.

During the 2nd scanline period cycle of operation, mux 506-3 is in its non-zero state, so that the $cv_{L1}$ valued samples now emerging as an output from first N-sample delay means 504-1 are recirculated back as a second input to summer 502-1 and added to the corresponding $bv_{L2}$ samples now being applied as a first input to summer 502-1. Therefore, during the 2nd scanline period cycle of operation, the sample value of each sample applied as an input to first N-sample delay means 504-1 is $cv_{L1} + bv_{L2}$. However, during the 2nd scanline period cycle of operation, mux 506-4 is in its zero state, so that the $cv_{L1}$ valued samples are not applied to the first input of summer 502-2.

During the 3rd scanline period cycle of operation, both mux 506-3 and 506-5 are in their zero state, so that no recirculation takes place of the $cv_{L1} + bv_{L2}$ valued samples now emerging as an output from first N-sample delay means 504-1 back as a second input to summer 502-1. However, now mux 506-4 is in its non-zero state, so that these $cv_{L1} + bv_{L2}$ valued samples are forwarded through mux 506-4 to the first input of summer 502-2, and $av_{L3}$ valued samples are applied from multiplier 500-2 to the second input of summer 502-2. Thus, during the 3rd scanline period cycle of operation, $cv_{L1} + bv_{L2} + av_{L3}$ valued samples are applied as an input to second N-sample delay means 504-2.

During the 4th scanline period cycle of operation, both mux 506-3 and 506-5 are in there non-zero state, so that recirculation takes place of $cv_{L1} + bv_{L2} + av_{L3}$ valued samples now emerging as an output from second N-sample delay means 504-2 back as a third input to summer 502-2. Further, $bv_{L4}$ valued samples are now applied from multiplier 500-2 to the second input of summer 502-2. Therefore, $cv_{L1} + bv_{L2} + av_{L3} + bv_{L4}$ valued samples are now applied from the output of summer 502-2 to the input of second N-sample delay means 504-2. However, both mux 506-4 and 506-6 are now in their zero state, so that while the $cv_{L3}$ valued samples now emerging from the output of first N-sample delay means 504-1 are recirculated back to the second input of summer 502-1, these $cv_{L3}$ valued samples are not forwarded to the first input of summer 502-2, and the $cv_{L1} + bv_{L2} + av_{L3}$ valued samples now emerging as an output from second N-sample delay means 504-2 are not forwarded to the first input of summer 502-3. The recirculated $cv_{L3}$ valued samples are now added to $bv_{L4}$ valued samples in summer 502-1 and $cv_{L3} + bv_{L4}$ valued samples are applied to the input of first N-sample delay means 504-1.

During the 5th scanline period cycle of operation, both mux 506-3 and 506-5 are in their zero state, so that no recirculation takes place of the $Cv_{L3} + bv_{L4}$ valued samples now emerging as an output from first N-sample delay means 504-1 back as a second input to summer 502-1. However, now mux 506-4 and 506-6 are in their non-zero state, so that these $cv_{L3} + bv_{L4}$ valued samples are forwarded through mux 506-4 to the first input of summer 502-2 and the $cv_{L1} + bv_{L2} + av_{L3} + bv_{L4}$ valued samples now emerging from second N-sample delay means 504-2 are forwarded through mux 506-4 to the first input of summer 502-3. Further, the output $cv_{L5}$ from multiplier 500-3 is applied as a second input to summer 502-3, thereby deriving filtered output line Y1, comprising $cv_{L1}+bv_{L2}+av_{L3}+bv_{L4}+cv_{L5}$ valued samples, from the first 5-tap octave prefilter structure of the present invention, shown in FIG. 5a.

It will be noted that the status of the $cv_{L3}+bv_{L4}$ valued samples during the 5th scanline period cycle of operation is identical to the status of the $cv_{L1}+bv_{L2}$ valued samples during the 3rd scanline period cycle of operation. Thus, the 6th and 7th scanline period cycles of operation will correspond, respectively, to the 4th and 5th scanline period cycles of operation. Therefore, filtered output line Y2, comprising $cv_{L3}+bv_{L4}+av_{L5}+bv_{L6}+cv_{L7}$ valued samples, will be derived in the 7th scanline period cycle of operation. In a similar manner, filtered output line Y3, comprising $cv_{L5}+bv_{L6}+av_{L7}+bv_{L8}cv_{L9}$ valued samples, will be derived in the 9th scanline period cycle of operation; filtered output line Y4, comprising $cv_{L7}+bv_{L8}+av_{L9}+bv_{L10}+cv_{L11}$ valued samples, will be derived in the 11th scanline period cycle of operation; and so forth.

From the above discussion, it is plain that filtered output lines occur only for each successive odd scanline period cycle of operation, starting with the 5th scanline period cycle of operation. Therefore, downsampling by a factor of 2 takes place between the input and output lines of the first 5-tap octave prefilter structure of the present invention shown in FIG. 5a.

Operating FIG. 5a in its second (upsampling) mode requires only three changes from those described above with respect to its first (downsampling) mode. First, no recirculation of the respective outputs of N-sample delay means 504-1 and 504-2 is ever required in the upsampling mode. Therefore, the timing control of each of respective mux 506-3, 506-4, 506-5 and 506-6 is set at all times so as to forward the output of N-sample delay means 504-1 to the first input of summer 502-2 and forward the output of N-sample delay means 504-2 to the first input of summer 502-3 and prevent recirculation of the output of each of N-sample delay means 504-1 and 504-2. Second, in order to upsample-by-two, the respective pixel sample values of each even input line L2, L4, L6, L8 ... is a duplicate of its immediately preceding input line L1, L3, L5, L7 ... Third, because no elimination of odd output lines takes place in upsampling, the first input line applied to multiplier 500-2 is L2 (rather than L3) and the first input line applied to multiplier 500-3 is L3 (rather than L5). However, still only odd input lines (i.e., L3, L5, L7 ... ) are applied as an input to multiplier 500-3.

Taking into account that each even input line L2, L4 ... in the upsampling mode of operation of FIG. 5a is a duplicate of each odd input line L1, L3 ..., means that an odd input line designation may be substituted for its corresponding even input line designation in each of the following expressions. The result of the aforesaid changes in the operation of FIG. 5a when operating in its upsampling mode, is that the filtered output line Y1 therefrom comprises $cv_{L1}+av_{L3}+cv_{L5}$ valued samples and the filtered output line Y2 therefrom comprises $bv_{L3}+bv_{L5}$ valued samples. Generalizing, each odd filtered output line Yi therefrom comprises $cv_{Li}+av_{L(i+2)}+cv_{L(i+4)}$ valued samples and each even filtered output line Y(i+1) therefrom comprises $bv_{L(i+2)}+bv_{L(i+4)}$ valued samples.

Because in the upsampling mode, the b kernel-function coefficients make no contribution to each odd filtered output line Yi and the c and a kernel-function coefficients make no contribution to each even filtered output line Y(i+1) the pixel sample values of both the odd and even output lines is reduced by one-half. To overcome this problem each of the kernel-function coefficients c, b, a, b, c should have twice its normal value in the case of upsampling by a factor of 2. For instance, if the normal values for the kernel-function coefficients c, b, a, b, c are 1/16, ¼, ⅜, ¼, 1/16, the values of these coefficients in the upsampling mode of FIG. 5a should be ⅛, ½, ¾, ½, ⅛.

In order to operate FIG. 5a in its third (transparent) mode, the timing control of mux 506a-2 at all times is set so that multiplier 500-2 receives only input kernel-function coefficient a, and the timing control of each of respective mux 506-3, 506-4, 506-5 and 506-6 is set at all times so as to forward the output of N-sample delay means 504-1 to the first input of summer 502-2 and forward the output of N-sample delay means 504-2 to the first input of summer 502-3 and prevent recirculation of the output of each of N-sample delay means 504-1 and 504-2. Further, in the transparent mode, all of the input lines L1, L2, L3, L4, L5 ... are applied to multiplier 500-2 (rather than only input lines L3, L4, L5 ... ), the respective values of the kernel-function coefficients c, b, a are set to c=0, b=0 and a=1. In addition, every one of the input lines L1, L2, L3, L4, L5 ... in the transparent mode is comprised of its own original pixel sample values (i.e., none of input lines L1, L2, L3, L4, L5 ... is comprised of pixel sample values that are a duplicate of the pixel sample values of its immediately preceding input line). The result is that FIG. 5a, in its transparent mode, operates merely as a single N-sample delay line that translates each input line L1, L2, L3, L4, L5 ... to its corresponding output line Y1, Y2, Y3, Y4, Y5 ... with a one-line delay.

Figure 5B:
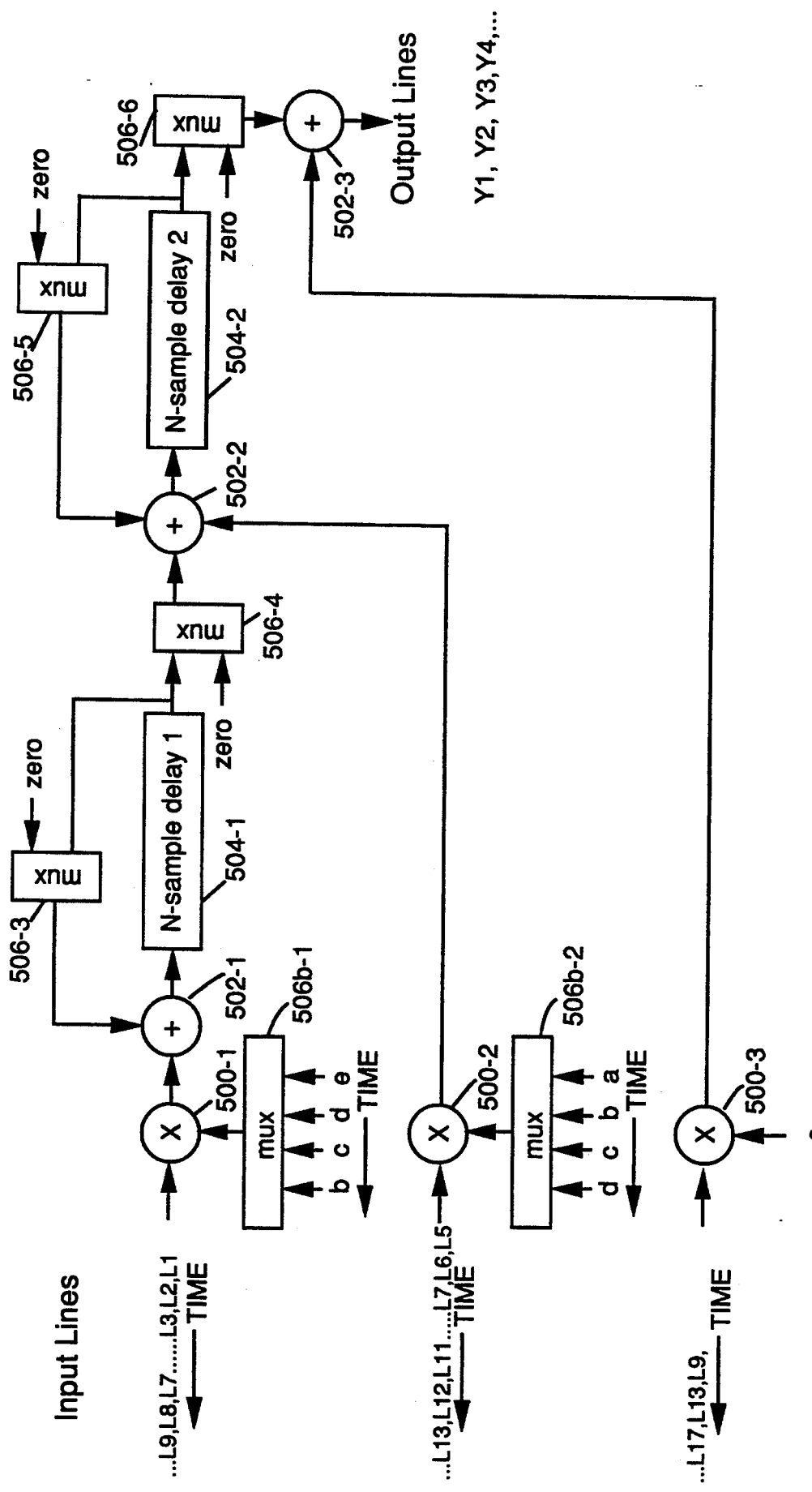
FIG. 5b is a block diagram of a .second implementation of a five-tap octave digital filter providing a multiplication by a factor of 4 in the vertical dimension of a video image, which second implementation is suitable for realization on a VLSI chip.

Referring now to FIG. 5b, there is shown a second 5-tap octave prefilter structure of the present invention which is specifically shown in its first mode of operation for providing downsampling by a factor of 4. The only difference in physical structure between that of FIG. 5b and that of above-described FIG. 5a is that the 2-input mux 506a-1 and 506a-2 of FIG. 5a are replaced in FIG. 5b by 4-input mux 506b-1 and 506b-2. Mux 506b-1 operates cyclically to forward each of the 4 kernel-function coefficients e, d, c and b, in turn, to the multiplier input of multiplier 500-1. Mux 506b-2 operates cyclically to forward each of the 4 kernel-function coefficients a, b, c and d, in turn, to the multiplier input of multiplier 500-2. Further, the kernel-function coefficient e is directly applied to the input of multiplier 500-3.

Besides this difference in physical structure, there are the following differences in signal timing and control between that employed by FIG. 5b in its downsampling mode of operation and that employed by FIG. 5a in its downsampling mode of operation. In FIG. 5b, starting with input line L5, every input line is applied to the multiplicand input of multiplier 500-2, and, starting with input line L9, every fourth input line (i.e., L13, L17 ... ) is applied to the multiplicand input of multiplier 500-3. Further, the timing control of mux 506-3 and 506-5 is such that they are in their zero state only during scanline period cycles of operation 1, 5, 9, 13 ... and are in their non-zero state during all other scanline period cycles of operation; while the timing control of mux 506-4 and 506-6 is such that they are in their non-zero state only during scanline period cycles of operation 1, 5, 9, 13 . . . and are in their zero state during all other scanline period cycles of operation.

In the operation of the FIG. 5b structure, $ev_{L1}$ valued samples are applied to the input of first N-sample delay means 504-1 during scanline period cycle of operation 1. During each of the scanline period cycles of operation 2 to 4, successive older recirculated sample values emerging as an output from first N-sample delay means 504-1, that are applied to the second input of summer 502-1, are added to new sample values that are applied to the first input of summer 502-1 (in the manner described above in detail in connection with FIG. 5a). This results in $ev_{L1}+dv_{L2}+cv_{L3}+bv_{L4}$ valued samples being applied to the input of first N-sample delay means 504-1 during the 4th scanline period cycle of operation. However, when these $ev_{L1}+dv_{L2}+cv_{L3}+bv_{L4}$ valued samples emerge as an output from first N-sample delay means 504-1 during the 5th scanline period cycle of operation, mux 506-3 is in its zero value state and mux 506-4 is in its non-zero value state. Therefore, these $ev_{L1}+dv_{L2}+cv_{L3}+bv_{L4}$ valued samples are forwarded to the first input of summer 502-2, where they are added to $av_{L5}$ valued samples applied to the second input of summer 502-2 before being applied as an input to second N-sample delay means 504-2.

During each of the scanline period cycles of operation 6 to 8, in which successive older recirculated sample values emerging as an output from second N-sample delay means 504-2, that are applied to the third input of summer 502-2, are added to new sample values that are applied to the second input of summer 502-2 results in $ev_{L1}+dv_{L2}+cv_{L3}+bv_{L4}+av_{L5}+bv_{L6}+cv_{L7}+dv_{L8}$ being applied to the input of second N-sample delay means 504-2 during the 8th scanline period cycle of operation. However, when these $ev_{L1}+dv_{L2}+cv_{L3}+bv_{L4}+av_{L5}+bv_{L6}+cv_{L7}+dv_{L8}$ valued samples emerge as an output from first N-sample delay means 504-1 during the 9th scanline period cycle of operation, mux 506-5 is in its zero value state and mux 506-6 is in its non-zero value state. Therefore, these $ev_{L1}+dv_{L2}+cv_{L3}+bv_{L4}+av_{L5}+bv_{L6}+cv_{L7}+dv_{L8}$ valued samples are forwarded to the first input of summer 502-3, where they are added to $ev_{L9}$ valued samples that are applied to the second input of summer 502-3. This results in the value of samples from the output of summer 502-3, which constitutes filtered output line Y1, being $ev_{L1}+dv_{L2}+cv_{L3}+bv_{L4}+av_{L5}+bv_{L6}+cv_{L7}+dv_{L8}+ev_{L9}$.

In a similar manner, the value of samples constituting filtered output line Y2 is $ev_{L5}+dv_{L6}+cv_{L7}+bv_{L8}+av_{L9}+bv_{L10}+cv_{L11}+dv_{L12}+ev_{L13}$; the value of samples constituting filtered output line Y3 is $ev_{L9}+dv_{L10}+cv_{L11}+bv_{L12}+av_{L13}+bv_{L14}+cv_{L15}+dv_{L16}+ev_{L17}$; and so forth.

From the above discussion, it is plain in the downsampling mode of FIG. 5b that filtered output lines occur only for each successive 4th scanline period cycle of operation, starting with the 9th scanline period cycle of operation. Therefore, downsampling by a factor of 4 has taken place between the input and output lines of the second 5-tap octave prefilter structure of the present invention shown in FIG. 5b.

The changes in FIG. 5b in its upsampling mode are similar to the above-described changes in FIG. 5a in its upsampling mode, with the exception that, in each successive group of four successive input lines L1 to L4, L5 to L8, . . . in FIG. 5b, the pixel sample values of each of the three latter input lines of that group is a duplicate of the pixel sample values of the first input line of that group. Taking this duplicate relationship into account means that the input line designation of the first input line of each group (i.e., L1, L5, L9 . . . ) may be substituted for the designations of each of the three latter input lines of that group (i.e., L2 to L4, L6 to L8, L10 to L12 . . . ) in each of the following expressions. Thus, the result of the aforesaid changes in the operation of FIG. 5b when operating in its upsampling mode, is that the first filtered output line Yi of each of successive groups of four successive output lines (where Yi corresponds to Y1, Y5, Y9 . . . ) comprises $ev_{Li}+av_{L(i+4)}+ev_{L(i+8)}$ valued samples; the second filtered output line Y(i+1) of each of these successive groups comprises $bv_{L(i+4)}+dv_{L(i+8)}$ valued samples; the third filtered output line Y(i+2) of each of these successive groups comprises $cv_{L(i+4)}+cv_{L(i+8)}$ valued samples, and the fourth filtered output line Y(i+3) of each of these successive groups comprises $dv_{L(i+4)}+bv_{L(i+8)}$ valued samples.

Figure 5C:
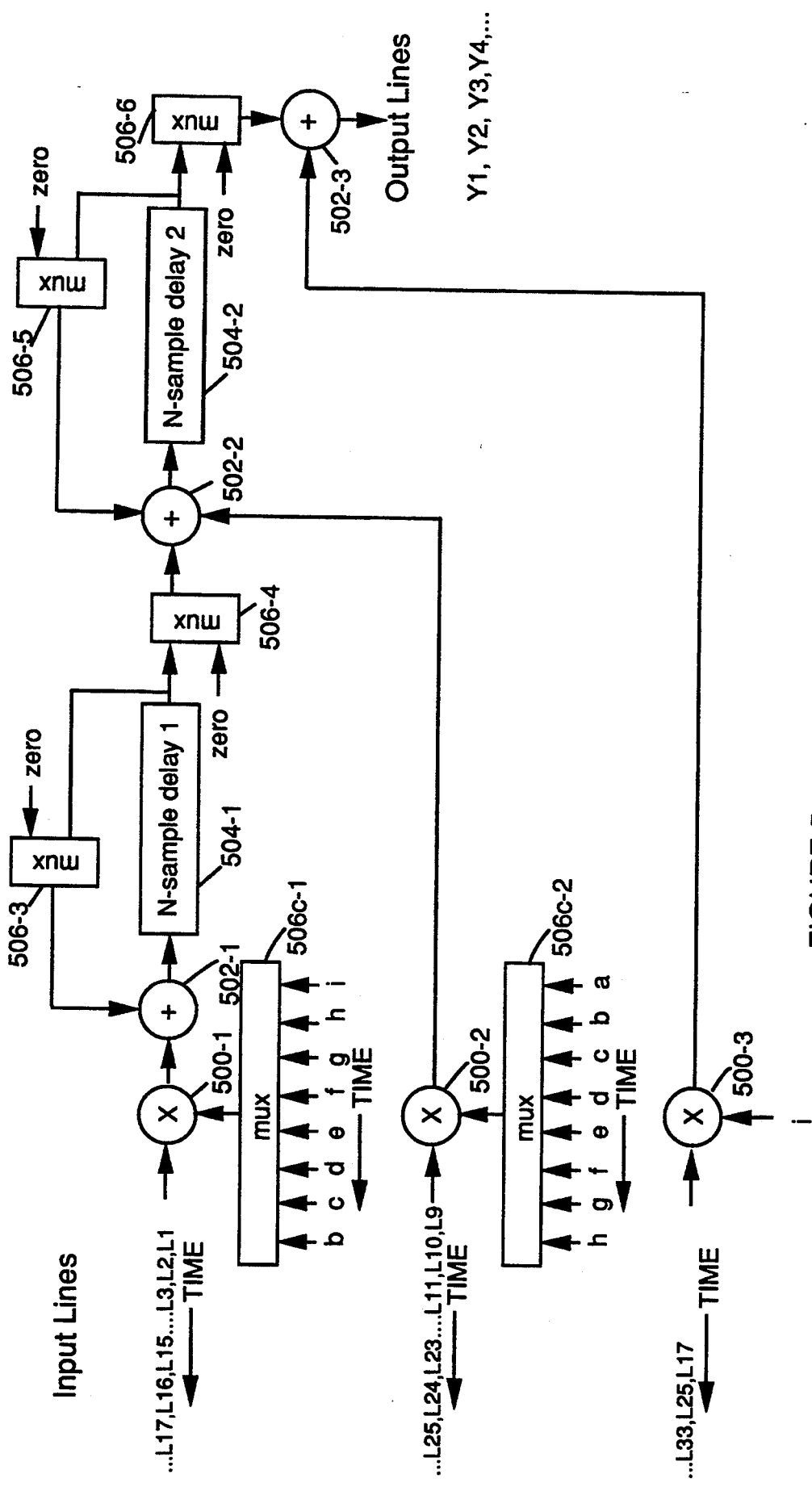
FIG. 5c is a block diagram of a third implementation of a five-tap octave digital filter providing a multiplication by a factor of 8 in the vertical dimension of a video image, which third implementation is suitable for realization on a VLSI chip.

Referring now to FIG. 5c, there is shown a third 5-tap octave prefilter structure of the present invention which is specifically shown in its first mode of operation for providing downsampling by a factor of 8. The only difference in physical structure between that of FIG. 5c and that of above-described FIG. 5a is that the 2-input mux 506a-1 and 506a-2 of FIG. 5a are replaced in FIG. 5c by 8-input mux 506c-1 and 506c-2. Mux 506c-1 operates cyclically to forward each of the 8 kernel-function coefficients i, h, g, f, e, d, c and b, in turn, to the multiplier input of multiplier 500-1. Mux 506c-2 operates cyclically to forward each of the 8 kernel-function coefficients a, b, c, d, e, f, g and h, in turn, to the multiplier input of multiplier 500-2. Further, the kernel-function coefficient i is directly applied to the input of multiplier 500-3.

The differences in signal timing and control between that employed by FIG. 5c and that employed by FIG. 5a are somewhat similar to the differences in signal timing and control, described above, between that employed by FIG. 5b and that employed by FIG. 5a. In the case of FIG. 5c, starting with input line L9, every input line is applied to the multiplicand input of multiplier 500-2, and, starting with input line L17, every eighth input line (i.e., L25, L33 . . . ) is applied to the multiplicand input of multiplier 500-3. Further, the timing control of mux 506-3 and 506-5 is such that they are in their zero state only during scanline period cycles of operation 1, 9, 17 . . . and are in their non-zero state during all other scanline period cycles of operation; while the timing control of mux 506-4 and 506-6 is such that they are in their non-zero state only during scanline period cycles of operation 1, 9, 17 . . . and are in their zero state during all other scanline period cycles of operation.

Employing the same operational approach described above in detail in connection with FIGS. 5a and 5b, the FIG. 5c sample values of the filtered output line Y1 is $iv_{L1}+hv_{L2}+gv_{L3}+fv_{L4}+ev_{L5}+dv_{L6}+cv_{L7}+bv_{L8}+av_{L9}+bv_{L10}+cv_{L11}+dv_{L12}+ev_{L13}+fv_{L14}+gv_{L15}+hv_{L16}+iv_{L17}$. The sample values of the filtered output line Y2 is $iv_{L9}+hv_{L10}+gv_{L11}+fv_{L12}+ev_{L13}+dv_{L14}+cv_{L15}+bv_{L16}+av_{L7}+bv_{L18}+cv_{L19}+dv_{L20}+ev_{L21}+fv_{L22}+gv_{L23}+hv_{L24}+iv_{L25}$. The sample values of the filtered output line Y3 is $iv_{L9}+hv_{L10}+gv_{L11}+fv_{L12}+ev_{L13}+dv_{L14}+cv_{L15}+b$-

$v_{L16} + av_{L17} + bv_{L18} + cv_{L19} + dv_{L20} + ev_{L21} + fv_{L22} + gv_{L23} + hv_{L24} + iv_{L25}$.

From the above discussion, it is plain that filtered output lines occur only for each successive 8th scanline period cycle of operation, starting with the 17th scanline period cycle of operation. Therefore, downsampling by a factor of 8 has taken place between the input and output lines of the third 5-tap octave prefilter structure of the present invention shown in FIG. 5c.

The changes in FIG. 5c in its upsampling mode are similar to the above-described changes in FIG. 5a in its upsampling mode, with the exception that, in each successive group of eight successive input lines L1 to L8, L9 to L16, . . . in FIG. 5c, the pixel sample values of each of the seven latter input lines of that group is a duplicate of the pixel sample values of the first input line of that group. Taking this duplicate relationship into account means that the input line designation of the first input line of each group (i.e., L1, L9, L17 . . . ) may be substituted for the designations of each of the seven latter input lines of that group (i.e., L2 to L8, L10 to L16, L18 to L24 . . . ) in each of the following expressions. Thus, the result of the aforesaid changes in the operation of FIG. 5c when operating in its upsampling mode, is that the first filtered output line Yi of each of successive groups of eight successive output lines (where Yi corresponds to Y1, Y9, Y17 . . . ) comprises $iv_{Li} + av_{(i+8)} + iv_{L(i+16)}$ valued samples; the second filtered output line Y(i+1) of each of these successive groups comprises $bv_{L(i+8)} + hv_{L(i+16)}$ valued samples; the third filtered output line Y(i+2) of each of these successive groups comprises $cv_{L(i+8)} + gv_{L(i+16)}$ valued samples; the fourth filtered output line Y(i+3) of each of these successive groups comprises $dv_{L(i+8)} + fv_{L(i+16)}$ valued samples; the fifth filtered output line Y(i+4) of each of these successive groups comprises $ev_{L(i+8)} + ev_{L(i+16)}$ valued samples; the sixth filtered output line Y(i+5) of each of these successive groups comprises $fv_{L(i+8)} + dv_{L(i+16)}$ valued samples; the seventh filtered output line Y(i+6) of each of these successive groups comprises $gv_{L(i+8)} + cv_{L(i+16)}$ valued samples, and the eighth filtered output line Y(i+7) of each of these successive groups comprises $hv_{L(i+8)} + bv_{L(i+16)}$ valued samples.

By means of suitable timing and control, the physical structure shown in FIG. 5c may be used to selectively provide downsampling or upsampling by a factor of 2 or factor of 4, in addition to providing downsampling or upsampling by a factor of 8. Downsampling or upsampling by a factor of 2 is accomplished by applying four sets of kernel-function coefficients c,b to 8-tap mux 506c-1, four sets of kernel-function coefficients a,b to 8-tap mux 506c-2, and kernel-function coefficient c as a multiplier to multiplier 500-3; and both applying input lines as a multiplicand to multipliers 500-2 and 500-3 and switching mux 506-3, 506-4, 506-5 and 506-6 between their zero value state and non-zero value states in accordance with the timing employed for downsampling or upsampling in FIG. 5a. Downsampling or upsampling by a factor of 4 is accomplished by applying two sets of kernel-function coefficients e,d,c,b to 8-tap mux 506c-1, two sets of kernel-function coefficients a,b,c,d to 8-tap mux 506c-2, and kernel-function coefficient e to multiplier 500-3; and both applying input lines as a multiplicand to multipliers 500-2 and 500-3 and switching mux 506-3, 506-4, 506-5 and 506-6 between their zero value state and non-zero value states in accordance with the timing employed for downsampling or upsampling in FIG. 5b.

Generalizing, the 5-tap octave prefilter structure of the present invention is able to provide for downsampling or upsampling of scan lines by a factor of $2^n$ by (1) employing $2^n$-tap mux 506-1 and 506-2, with mux 506-1 applying, in turn, each of the first $2^n$ coefficients of a $2^{n+1} + 1$ coefficient kernel function to the multiplier input of multiplier 500-1, mux 506-2 applying, in turn, each of the second $2^n$ coefficients of the $2^{n+1} + 1$ coefficient kernel function to the multiplier input of multiplier 500-2, and directly applying the last coefficient of the $2^{n+1} + 1$ coefficient kernel function to the multiplier input of multiplier 500-3; (2) applying every input line as a multiplicand input to multiplier 500-1; starting with input line $L2^{n+1}$ for downsampling or L2 for upsampling, applying every input line as a multiplicand input to multiplier 500-2; and, starting with input line $L2^{n+1} + 1$ for downsampling or L3 for upsampling, applying every $2^n$th input line as a multiplicand input to multiplier 500-3; and (3), for downsampling, maintaining mux 506-3 and 506-5 in their zero state, at most, only during all of scanline period cycles of operation 1, $2^{n+1}$, $2^{n+1} + 1$, $2^{n+2} + 1$, $2^{n+3} + 1$ . . . and maintaining mux 506-3 and 506-5 in their non-zero state during all other scanline period cycles of operation, while mux 506-4 and 506-6 are maintained in their non-zero state, at most, only during all of scanline period cycles of operation 1, $2^{n+1}$, $2^{n+1} + 1$, $2^{n+2} + 1$, $2^{n+3} + 1$ . . . and mux 506-4 and 506-6 are maintained in their zero state during all other scanline period cycles of operation, while, for upsampling, maintaining mux 506-3 and 506-5 in their zero state during all scanline period cycles of operation and maintaining mux 506-4 and 506-6 in their non-zero state during all scanline period cycles of operation.

The approach of the present invention is not limited in their application to the 5-tap filter structures shown in FIGS. 5a, 5b and 5c for illustrative purposes. In general, a filter structure having an odd number of taps T requires a $2^n(T-1)/2 + 1$-coefficient kernel function (so that a 5-tap filter structure requires a $2^{n+1} + 1$ coefficient kernel function), while a filter structure having an even number of taps T requires a $2^n T/2$-coefficient kernel function. In accordance with the approach of the present invention, which may be applied to filter structures having any number of odd or even taps, the number of N-sample delay means required is equal to the integer portion of T/2, where T is the number of filter taps. Thus, while either a 5-tap or a 4-tap filter requires two N-sample delay means, either a 3-tap or a 2-tap filter requires only one N-sample delay means and either a 7-tap or a 6-tap filter requires three N-sample delay means. Associated with the input of each N-sample delay means is a kernel-function coefficient mux (e.g., mux 506a-1 and 506a-2 of FIG. 5a), a multiplier (e.g., multipliers 500-1 and 500-2 of FIG. 5a), and a summer (e.g., summers 502-1 and 502-2 of FIG. 5a). If the filter is an odd-tap filter, an additional multiplier (e.g., multiplier 502-3 of FIG. 5a) and summer (e.g., summer 502-3 of FIG. 5a) are required to add the last kernel-function coefficient (e.g., coefficient c of FIG. 5a) weighted sample values to the kernel-function weighted sample values emerging from the last N-sample delay means (e.g., N-sample delay means 504-2 of FIG. 5a). If the filter is an even-tap filter, no such additional multiplier and summer are required. Associated with the output of each N-sample delay means is (1) a first zero-value inserting mux (e.g., mux 506-3 and 506-5 of FIG. 5a) for controlling recirculation of this output back to the input of that N-sample delay means and (2) a second zero-value inserting mux (e.g., mux 506-4 and 506-6 of FIG. 5a) for controlling the forwarding of this output.

It has been assumed for illustrative purposes that the N samples of each N-sample delay means of the filter are all the pixel samples of a scanline of a video image that is being resized by the resampler of FIG. 3, so that each N-sample delay means provides a delay of one scanline period, thereby providing filtering in the vertical (Y) direction of the video image. However, by making N=1, so that each N-sample delay means provides a delay of only one pixel period, the filter will provide filtering in the horizontal (X) direction of the video image.

Figure 6C:
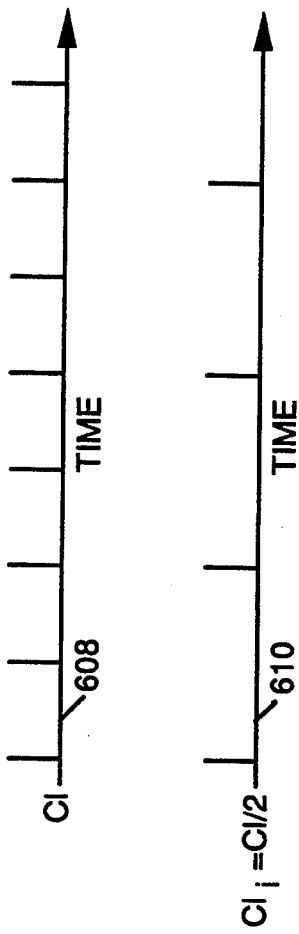
FIG. 6c shows a timing diagram illustrating the clocks used in implementing the present invention.
Figure 6C:
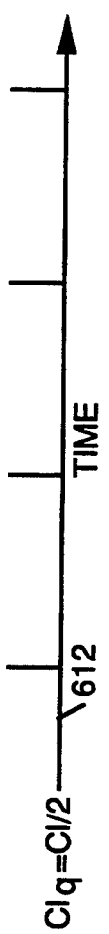

In the realization of the present invention employing pipeline architecture on a VLSI chip, it is desirable that a single clock frequency be used throughout and that this single clock frequency be able to meet the Nyquist criterion in the sampling of the highest frequency of the widest bandwidth component of an input signal. It is known that an NTSC video signal occurring in real time comprises a luminance component having a bandwidth of about 4 MHz and separate I and Q chrominance components each having a bandwidth of about 2 MHz. Therefore, in order to efficiently implement the present invention on a VLSI chip, it is desirable to employ time multiplex techniques in providing filtering in the horizontal (X) direction of the video image for the pixels of the I and Q chrominance components. Each of FIGS. 6a and 6b shows a different modification of FIG. 5a for accomplishing this.

Figure 6A:
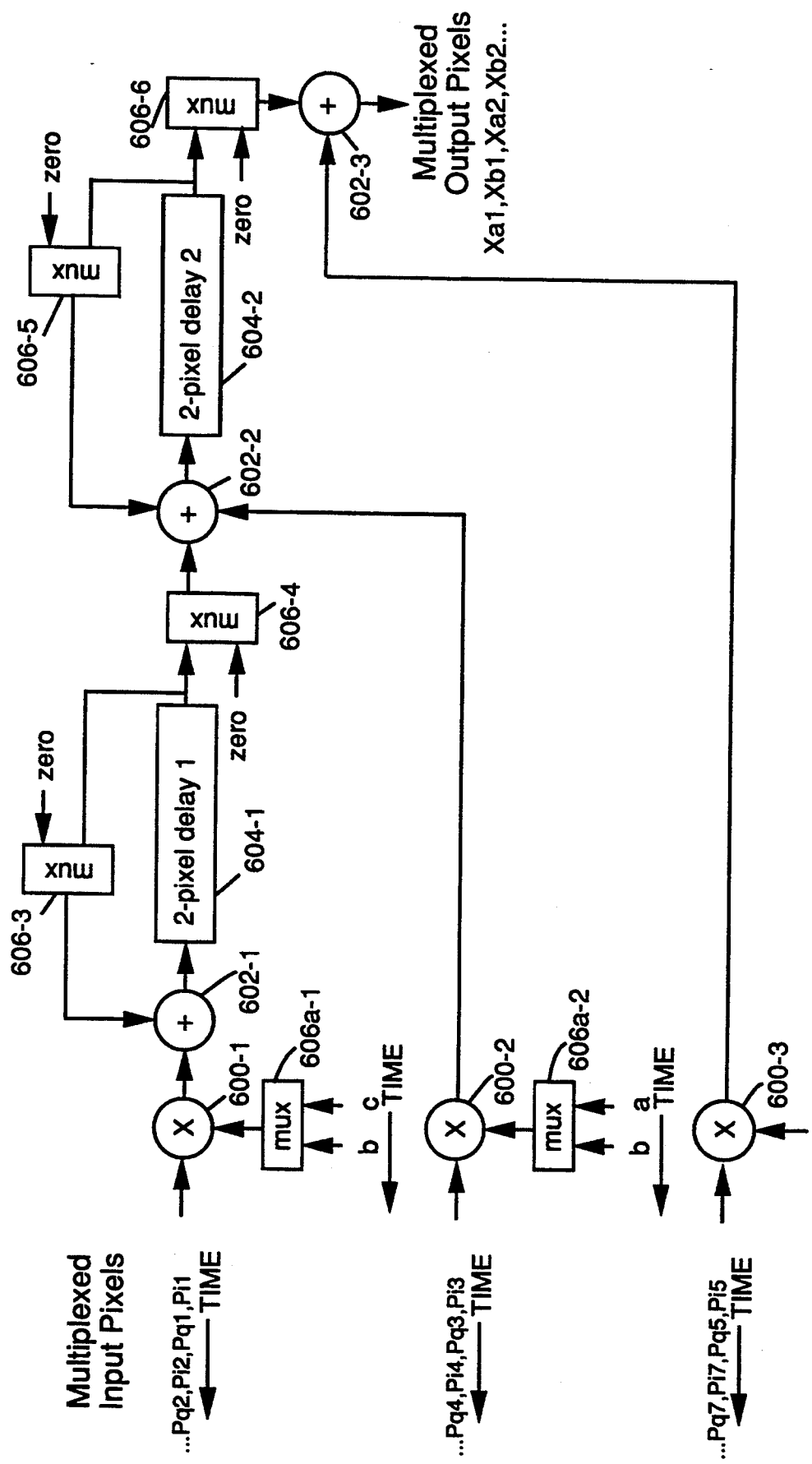
FIG. 6a is a block diagram of a first time-division multiplex modification of the first implementation of the five-tap octave digital filter shown in FIG. 5a providing a multiplication by a factor of 2 in the horizontal dimension of a video image, which modification is suitable for realization on a VLSI chip.
Figure 6B:
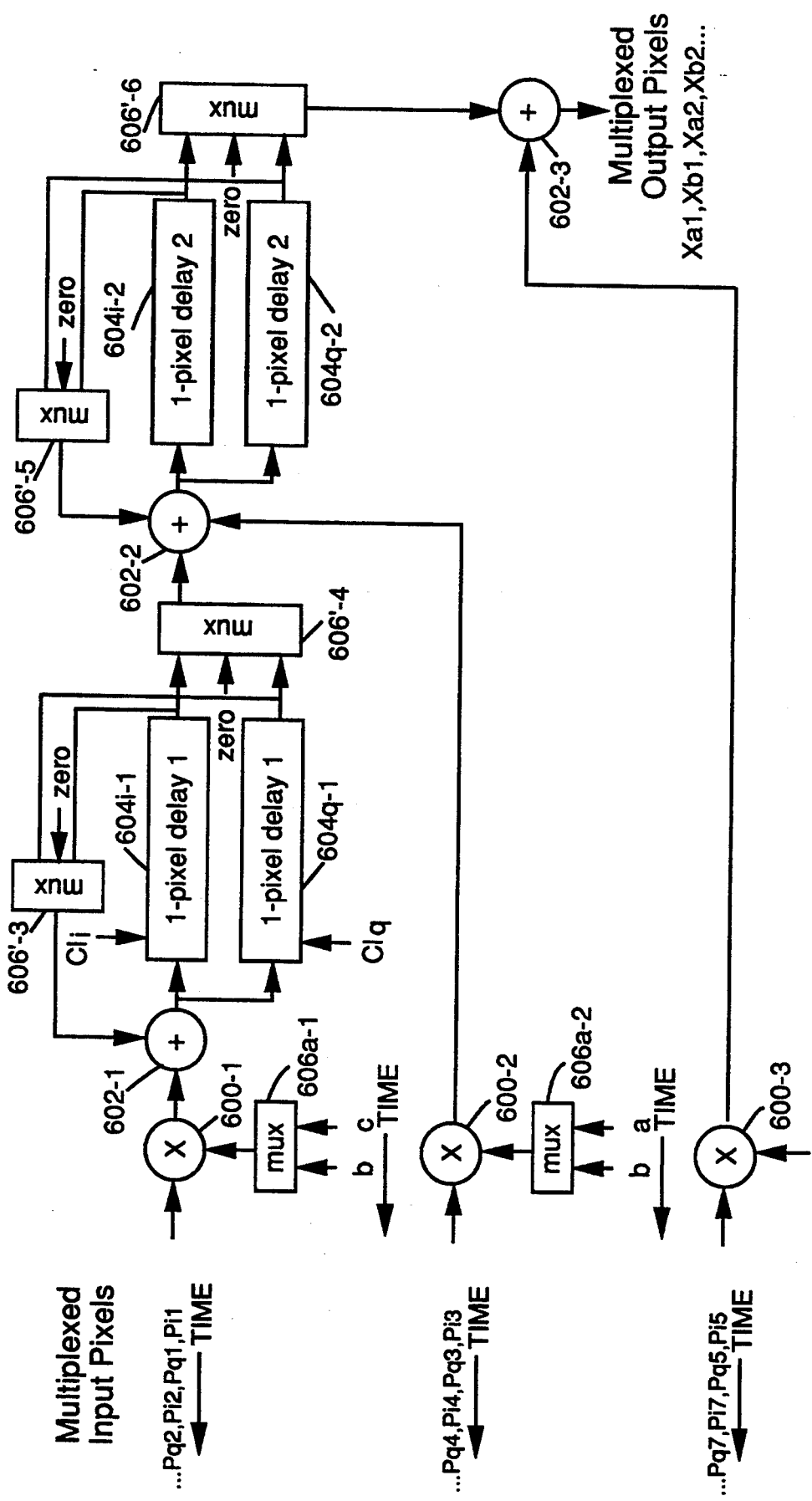
FIG. 6b is a block diagram of a second time-division multiplex modification of the first implementation of the five-tap octave digital filter shown in FIG. 5a providing a multiplication by a factor of 2 in the horizontal dimension of a video image, which modification is suitable for realization on a VLSI chip.

In FIG. 6a, respective elements 600-1, 600-2, 600-3, 602-1, 602-2, 602-3, 604-1, 604-2, 606a-1, 606a-2, 606-3, 606-4, 606-5 and 606-6 correspond to respective elements 500-1, 500-2, 500-3, 502-1, 502-2, 502-3, 504-1, 504-2, 506a-1, 506a-2, 506-3, 506-4, 506-5 and 506-6 of FIG. 5a. However, each of elements 604-1, 604-2 provides a delay of only 2 pixels, rather than the N pixels of an entire line provided by each of elements 504-1, 504-2.

As indicated in FIG. 6a, multiplier 600-1 receives, in turn, as a time-multiplexed multiplicand each of all the successive input I pixel sample values Pi1, Pi2 . . . interleaved with each of all the successive input Q pixel sample values Pq1, Pq2 . . . . Thus, the respective input I pixel samples and the respective input Q pixel samples occur on alternate clocks of the aforesaid single clock frequency, so that a sample period of each of the I pixels and a sample period of each of the Q pixels is twice that of a clock period. In a similar manner, multiplier 600-2 receives, in turn, as a time-multiplexed multiplicand each of all the successive input I pixel sample values Pi3, Pi4 . . . interleaved with each of all the successive input Q pixel sample values Pq3, Pq4 . . . and multiplier 600-3 receives, in turn, as a time-multiplexed multiplicand each of all the successive input I pixel sample values Pi5, Pi7 . . . interleaved with each of all the successive input Q pixel sample values Pq5, Pq7 . . .

Because of the time-multiplexed operation of FIG. 6a, each of multiplexers 606a-1, 606a-2, 606-3, 606-4, 606-5 and 606-6 is switched back and forth at one-half the rate at which each of corresponding multiplexers 506a-1, 506a-2, 506-3, 506-4, 506-5 and 506-6 is switched back and forth. Further, the fact that each of first and second delays 604-1 and 604-2 provides a 2-pixel delay ensures that delayed I chrominance pixels are added by summers 602-1, 602-2 and 602-3 only to other I chrominance pixels applied as inputs thereto, and that delayed Q chrominance pixels are added by summers 602-1, 602-2 and 602-3 only to other Q chrominance pixels applied as inputs thereto.

The timing circuitry associated with a VLSI chip for implementing the present invention may include means for deriving a pair of phase-displaced half-frequency clocks from the aforementioned single clock (as shown in FIG. 6c described below). The availability of such phase-displaced half-frequency clocks permits the present invention to be time-multiplexed implemented in the type of manner shown in below-described FIG. 6b. In fact, a type FIG. 6b implementation is incorporated in a VLSI chip that has actually been fabricated.

The implementation of FIG. 6b only differs from the implementation of FIG. 6a in that (1) the output from summer 602-1 is applied in parallel to each of first 1-pixel delays 604$i$-1 and 604$q$-1, rather than being applied to first 2-pixel delay 604-1; (2) the output from summer 602-2 is applied in parallel to each of second 1-pixel delays 604$i$-2 and 604$q$-2, rather than being applied to second 2-pixel delay 604-2; and (3) 3-input multiplexers 606'-3, 606'-4, 606'-5 and 606'-6, respectively, replace 2-input multiplexers 606-3, 606-4, 606-5 and 606-6.

As indicated in FIG. 6b, the timing of each of first 1-pixel delay 604$i$-1 and second 1-pixel delay 604$i$-2 is controlled by an I chrominance clock (Cl$_i$) and the timing of each of first 1-pixel delay 604$q$-1 and second 1-pixel delay 604$q$-2 is controlled by a Q chrominance clock (Cl$_q$). The relationship of each of Cl$_i$ and Cl$_q$ with respect to the single system clock C1 and to one another is shown by timing diagrams 608, 610 and 612 in FIG. 6c. Specifically, timing diagram 608 shows that the C1 clocks occur periodically at a given frequency; timing diagram 610 shows that the Cl$_i$ clocks occur at a frequency equal to one-half the C1 clock frequency with each Cl$_i$ clock being isochronous with the odd C1 clocks, and timing diagram 612 shows that the Cl$_q$ clocks occur at a frequency equal to one-half the C1 clock frequency with each Cl$_q$ clock being isochronous with the even C1 clocks. Thus, each Cl$_q$ clock is phase shifted with respect to each Cl$_i$ clock by one C1 clock period.

The timing control of the 3-input multiplexers at the C1 clock rate ensures that delayed I chrominance pixels are added by summers 602-1, 602-2 and 602-3 only to other I chrominance pixels applied as inputs thereto, and that delayed Q chrominance pixels are added by summers 602-1, 602-2 and 602-3 only to other Q chrominance pixels applied as inputs thereto.

For illustrative purpose, both the implementations of FIGS. 6a and 6b described above relate to time-division multiplex modification of the first implementation of the five-tap octave digital filter shown in FIG. 5a, which is capable of providing downsampling or upsampling by a factor of 2 in both the horizontal dimension and the vertical dimension. It is plain that the principles illustrated in FIGS. 6a and 6b may be extended to implementations of other octave digital filters, discussed above, having fewer or more than five taps and/or which provide downsampling or upsampling by any factor having a value $2^n$.

The implementation of FIG. 6b, besides being employed for time-multiplex processing the I and Q chrominance components, is also useful in time-multiplexing processing two half-resolution data streams (such as two half-resolution luminance signals).

The resampler of FIG. 3 or 3a is not limited in its use to the resizing of a video image. For instance, among other uses would be the conversion of motion-picture frames, (which occur at 24 frames/second) to NTSC video frames (which occur at 30 frames/second) or vice versa; and the conversion of NTSC-standard video frames (which occur at 60 interlaced fields/second) to European-standard video frames, (which 50 interlaced fields/second) or vice versa.

Further, while the octave prefilter with $2^n$ downsampling and upsampling capabilities of the present invention (of the type shown in FIGS. 5a, 5b and 5c) is particularly suitable for use in implementing the resampler of FIGS. 3 or 3a, its use is not limited thereto.

What is claimed is:

1. In apparatus for altering the sampling period of an input stream of digital-signal sample values that define D dimensional information, where D is at least one; wherein those digital-signal sample values of said input stream that define a given dimension of said information occur at a given sampling period P; and wherein said apparatus alters said given sampling period P by a factor equal to M/L, where L is a first positive integer greater in value than one and M is a second positive integer; the improvement wherein said apparatus comprises:

first means, including interpolation filter means, responsive to said digital-signal sample values of said input sample stream for producing a first derived sample stream of digital-signal sample values in which said given sampling period P of said input stream is multiplied directly by a factor equal to M'/CL, where C is a given positive integer and M' is smaller than CL, either $2^n(M'/CL)$ or $2^{-n}(M'/CL)$ is equal to M/L and the absolute value of n is at least equal to zero, so that the sampling period of said first derived sample stream is (M'/CL)P; and second means, including octave prefiltering and sample means, responsive to said first derived sample stream of digital-signal sample values for producing as an output a second derived sample stream of digital-signal sample values in which said first derived sampling period (M'/CL)P of said first derived sample stream is multiplied by a factor equal to either $2^n$ or $2^{-n}$ so that the sampling period of said second derived sample stream is (M/L)P.

2. The apparatus defined in claim 1, wherein: said M is a second positive integer that is smaller in value than the value of said first positive integer L; and the value of said given positive integer C is one; whereby $2^{-n}(M'/L)=M/L$.

3. The apparatus defined in claim 2, wherein: the value of n is equal to zero; whereby no multiplication takes place and M'/L=M/L.

4. The apparatus defined in claim 1, wherein: said M is a second positive integer that may be either smaller in value or larger in value than the value of said first positive integer L; the value of said given positive integer C is two; and the absolute value of n is at least equal to one; whereby $2^n(M'/2L)=M/L$ when M<L and $-^n(M'/2L)=M/L$ when M>L.

5. The apparatus defined in claim 1, wherein: said interpolation filter means includes third means which, during each of successive sample intervals equal in length to (M')P given sampling periods of said input stream, is responsive to each of a series of M'+1 samples that occur at said given sampling period P, wherein the respective sample-values of that series of M'+1 samples are $v_1, v_2, v_3 \ldots v_{M'-1}, v_{M'}$ and $v_{M'+1}$; and said third means inserts CL−1 interpolated samples, occurring at an interpolated sample period equal to (M'/CL)P, between the first sample and the (M'+1)th sample of that series, with each of said interpolated samples having an interpolated sample value which is a particular function of the respective sample values $v_1, v_2, v_3 \ldots v_{M'-1}, v_{M'}$ and $v_{M'+1}$ that depends on the ordinal position of that interpolated sample.

6. The apparatus defined in claim 5, wherein: the interpolated sample value of each of said CL−1 interpolated samples inserted by said third means is substantially a linear interpolation between that particular sample value $v_1, v_2, v_3, \ldots v_{M'-1}$ or $v_{M'}$ of that ordinal sample of said series which immediately precedes that interpolated sample and that particular sample value $v_2, v_3, \ldots v_{M'-1}, v_{M'}$ or $v_{M'+1}$ of that ordinal sample of said series which immediately follows that interpolated sample.

7. The apparatus defined in claim 1, wherein: said sample values of said input stream comprise pixel-period sample values in the horizontal (X) dimension and scanline-period sample values in the vertical (Y) dimension of 2-dimensional (X,Y) video-image information, and said given dimension of said video-image information is said vertical (Y) dimension thereof, whereby said given sampling period P is said scanline period and a series of N successive pixel sample values occur during each scanline-period P.

8. The apparatus defined in claim 1, wherein said second means includes a T-tap digital filter having a symmetrical low-pass filtering characteristic at baseband frequencies defined by the respective values of each of T kernel-function weighting coefficients, where T may be either an odd or even given plural integer having a value of at least three and/or the value of n is at least equal to two; and wherein said T-tap digital filter comprises:

a total number of N-sample delay means equal in number to only the integer portion of T/2, N being a given number of at least one, whereby said filter comprises a single N-sample delay means when said given plural integer has a value of two or three and comprises a plurality of N-sample delay means when said given plural integer has a value larger than three, and said plurality of N-sample delay means are serially connectable, in order, when said given plural integer has a value larger than three.

9. The apparatus defined in claim 8, wherein: said sample values of said input stream comprise pixel-period sample values in the horizontal (X) dimension and scanline-period sample values in the vertical (Y) dimension of 2-dimensional (X,Y) video-image information, and said given dimension of said video-image information is said vertical (Y) dimension thereof, whereby said given sampling period P is said scanline period and a series of N successive pixel sample values occur during each scanline-period P.

10. The apparatus defined in claim 8, wherein said T-tap digital filter further comprises:

first filter means including a summer associated with the input of each of said total number of N-sample delay means for applying a stream of kernel-function coefficient-weighted sample values to the input of that N-sample delay means with which it is associated;

second filter means associated with the output of each of said total number of N-sample delay means, said second filter means being responsive to first timing-control signals applied thereto during each of successive cycles of operation of said filter for selectively, during that cycle, either recirculating the stream of kernel-function coefficient-weighted sample values emerging from the output of that N-sample delay means with which it is associated back as an input to the summer of the first filter means associated therewith or, alternatively, forwarding the stream of kernel-function coefficient-weighted sample values emerging from the output of that N-sample delay means with which it is associated, thereby applying the output of each of the ordinal N-sample delay means preceding the last ordinal one as an input to the summer of the first filter means associated with its immediately following N-sample delay means and applying the output of the last ordinal N-sample delay means as said output stream of said filter; and third filter means responsive to second timing-control signals applied thereto during each of said successive cycles of operation of said filter for selectively, during selected cycles, controlling the application of each of individual streams of kernel-function coefficient-weighted sample values, corresponding to certain sample values of said first derived sample stream, as an input solely to the summer of that certain one of said first filter input means that corresponds thereto;

whereby the value of n, and hence the amount of multiplication provided by said filter, may be varied without structural change solely by controlling the sequence of respective first and second timing-control signals applied thereto during said successive cycles of operation of said filter.

11. The apparatus defined in claim 10, where T is an odd given plural integer, and wherein:

said second filter means associated with the output of the last ordinal one of the N-sample delay means includes a summer having the output of the last ordinal N-sample delay means being applied as an input thereto and the output thereof constituting said output stream of said filter; and said third filter means is responsive to second timing-control signals applied thereto during each of said successive cycles of operation of said filter for selectively, during selected cycles, controlling the application of an additional input stream of kernel-function coefficient-weighted sample values, corresponding to certain sample values of said first derived sample stream, as an input to the summer of said second filter means associated with the output of the last ordinal one of the N-sample delay means.

12. The apparatus defined in claim 11, wherein said T-tap digital filter is a 5-tap digital filter employing a $2^{n+1}+1$-coefficient kernel function, and wherein:

each of said second filter means, in response to said first timing-control signals, is effective in selectively forwarding the stream of kernel-function coefficient-weighted sample values emerging from the output of that N-sample delay means with which it is associated, at most, only during filter cycles of operation $1, 2^{n+1}, 2^{n+1}+1, 2^{n+2}+1, 2^{n+3}+1, 2^{n+4}+1 \ldots$, and selectively recirculating the stream of kernel-function coefficient-weighted sample values emerging from the output of that N-sample delay means with which it is associated back as an input to the summer of the first filter means associated therewith during all other filter cycles of operation; and said third filter means includes first multiplier means having its output coupled to an input of the summer of that first filter means associated with the input to the first ordinal N-sample delay means, second multiplier means having its output coupled to an input of the summer of that first filter means associated with the input to the second ordinal N-sample delay means, and third multiplier means having its output coupled to an input of the summer of that second filter means associated with the output of the second ordinal one of the N-sample delay means;

said first multiplier means, during each of said successive cycles of operation, starting with the first cycle of operation, multiplying each of successive series of N samples of said first derived sample stream, in turn, by a different one of each of the successive ordinal ones of the first $2^n$ coefficients of said $2^{n+1}+1$-coefficient kernel function;

said second multiplier means, during each of said successive cycles of operation, starting with the $2^{n+1}$ cycle of operation, multiplying each of successive series of N samples of said first derived sample stream, in turn, by a different one of each of the successive ordinal ones of the second $2^n$ coefficients of said $2^{n+1}+1$-coefficient kernel function; and said third multiplier means, starting with said $2^{n+1}+1$ cycle of operation, and thereafter only during each of every $2^n$th cycle of operation subsequent to said $2^{n+1}+1$ cycle of operation, multiplying the series of N samples of said first derived sample stream then taking place during that cycle of operation by the last ordinal coefficient of said $2^{n+1}+1$-coefficient kernel function.

13. The apparatus defined in claim 10, wherein:

said first timing-control signals is such as to selectively effect recirculating of the stream of kernel-function coefficient-weighted sample values emerging from the output of each of said N-sample delay means only during that one of predetermined sets of selected certain ones of said successive cycles of operation of said filter that is individually associated with that N-sample delay means, and to effect forwarding of the stream of kernel-function coefficient-weighted sample values emerging from the output of each of said N-sample delay means during all unselected ones of said successive cycles of operation of said filter; and said selected certain ones of said successive cycles of operation of said filter of each of said predetermined sets is such as to effect a downsampling by a factor of $2^n$ between said first derived sample stream and said second derived sample stream.

14. The apparatus defined in claim 10, wherein:

said first timing-control signals is such as to effect forwarding all of the stream of kernel-function coefficient-weighted sample values emerging from the output of each of said N-sample delay means during all of said successive cycles of operation of said filter;

whereby there is effected an upsampling by a factor of $2^n$ between said first derived sample stream and said second derived sample stream.

15. The apparatus defined in claim 10, wherein:

said input stream of digital-signal sample values comprises respective time-multiplexed first and second component streams of digital-signal sample values in which the digital-signal sample values of said second component stream are interleaved with the digital-signal sample values of said first component stream; and said sequence of said respective first and second timing-control signals applied thereto during said successive cycles of operation of said filter is such as to independently operate on the digital-signal sample values of said first component stream and the digital-signal sample values of said first component stream during each of said successive cycles of operation of said filter.

16. In a digital octave prefiltering and sample multiplication structure responsive to an input stream of digital-signal sample values occurring at a sampling period P for producing an output stream of digital-signal sample values occurring at a sampling period $(2^n)P$ where the absolute value of n is at least equal to zero; wherein said prefiltering and sample multiplication means is a T-tap digital filter having a symmetrical low-pass filtering characteristic at baseband frequencies defined by the respective values of T kernel-function weighting coefficients, where T may be either an odd or even given plural integer; the improvement wherein said given plural integer has a value of at least three and/or the absolute value of n is at least equal to two, and said octave prefiltering and sample multiplication structure comprises;

a total number of N-sample delay means equal in number to only the integer portion of T/2, N being a given number of at least one, whereby said structure comprises a single N-sample delay means when said given plural integer has a value of two or three and comprises a plurality of N-sample delay means when said given plural integer has a value larger than three, and said plurality of N-sample delay means are serially connectable, in order, when said given plural integer has a value larger than three.

17. The octave prefiltering and sample multiplication structure defined in claim 16 further comprising:

first means including a summer associated with the input of each of said total number of N-sample delay means for applying a stream of kernel-function coefficient-weighted sample values to the input of that N-sample delay means with which it is associated;

second means associated with the output of each of said total number of N-sample delay means, said second means being responsive to first timing-control signals applied thereto during each of successive cycles of operation of said structure for selectively, during that cycle, either recirculating the stream of kernel-function coefficient-weighted sample values emerging from the output of that N-sample delay means with which it is associated back as an input to the summer of the first means associated therewith or, alternatively, forwarding the stream of kernel-function coefficient-weighted sample values emerging from the output of that N-sample delay means with which it is associated, thereby applying the output of each of the ordinal N-sample delay means preceding the last ordinal one as an input to the summer of the first means associated with its immediately following N-sample delay means and applying the output of the last ordinal N-sample delay means as said output stream of said octave prefiltering and sample multiplication structure; and third means responsive to second timing-control signals applied thereto during each of said successive cycles of operation of said structure for selectively, during selected cycles, controlling the application of each of individual input streams of kernel-function coefficient-weighted sample values as an input solely to the summer of that certain one of said first input means that corresponds thereto;

whereby the value of n, and hence the amount of multiplication provided by said octave prefiltering and sample multiplication structure, may be varied without structural change solely by controlling the sequence of respective first and second timing-control signals applied thereto during said successive cycles of operation of said structure.

18. The octave prefiltering and sample multiplication structure defined in claim 17, where T is an odd given plural integer, and wherein:

said second means associated with the output of the last ordinal one of the N-sample delay means includes a summer having the output of the last ordinal N-sample delay means being applied as an input thereto and the output thereof constituting said output stream of said octave prefiltering and sample multiplication structure; and said third means is responsive to second timing-control signals applied thereto during each of said successive cycles of operation of said filter for selectively, during selected cycles, controlling the application of an additional input stream of kernel-function coefficient-weighted sample values as an input to the summer of said second means associated with the output of the last ordinal one of the N-sample delay means.

19. The octave prefiltering and sample multiplication structure defined in claim 18, wherein said T-tap digital filter is a 5-tap digital filter employing a $2^{n+1}+1$-coefficient kernel function, and wherein:

each of said second means, in response to said first timing-control signals, is effective in selectively forwarding the stream of kernel-function coefficient-weighted sample values emerging from the output of that N-sample delay means with which it is associated, at most, only during filter cycles of operation 1, $2^n+1$, $2^{n+1}+1$, $2^{n+2}+1$, $2^{n+3}+1$, $2^{n+4}+1$ . . . , and selectively recirculating the stream of kernel-function coefficient-weighted sample values emerging from the output of that N-sample delay means with which it is associated back as an input to the summer of the first filter means associated therewith during all other cycles of operation; and said third means includes first multiplier means having its output coupled to an input of the summer of that first means associated with the input to the first ordinal N-sample delay means, second multiplier means having its output coupled to an input of the summer of that first means associated with the input to the second ordinal N-sample delay means, and third multiplier means having its output coupled to an input of the summer of that second means associated with the output of the second ordinal one of the N-sample delay means;

said first multiplier means, during each of said successive cycles of operation, starting with the first cycle of operation, multiplying each of successive series of N samples of said input stream, in turn, by a different one of each of the successive ordinal ones of the first $2^n$ coefficients of said $2^{n+1}+1$-coefficient kernel function;

said second multiplier means, during each of said successive cycles of operation, starting with the $2^n+1$ cycle of operation, multiplying each of successive series of N samples of said input stream, in turn, by a different one of each of the successive ordinal ones of the second $2^n$ coefficients of said $2^{n+1}+1$-coefficient kernel function; and said third multiplier means, starting with said $2^{n+1}+1$ cycle of operation, and thereafter only during each of every $2^n$th cycle of operation subsequent to said $2^{n+1}+1$ cycle of operation, multiplying the series of N samples of said input stream then taking place during that cycle of operation by the last ordinal coefficient of said $2^{n+1}+1$-coefficient kernel function.

20. The octave prefiltering and sample multiplication structure defined in claim 17, wherein:

said first timing-control signals is such as to selectively effect recirculating of the stream of kernel-function coefficient-weighted sample values emerging from the output of each of said N-sample delay means only during that one of predetermined sets of selected certain ones of said successive cycles of operation of said filter that is individually associated with that N-sample delay means, and to effect forwarding of the stream of kernel-function coefficient-weighted sample values emerging from the output of each of said N-sample delay means during all unselected ones of said successive cycles of operation of said filter; and said selected certain ones of said successive cycles of operation of said filter of each of said predetermined sets is such as to effect a downsampling by a factor of $2^n$ between said first derived sample stream and said second derived sample stream.

21. The octave prefiltering and sample multiplication structure defined in claim 17, wherein:

said first timing-control signals is such as to effect forwarding all of the stream of kernel-function coefficient-weighted sample values emerging from the output of each of said N-sample delay means during all of said successive cycles of operation of said filter;

whereby there is effected an upsampling by a factor of $2^n$ between said first derived sample stream and said second derived sample stream.

22. The octave prefiltering and sample multiplication structure defined in claim 17, wherein:

said input stream of digital-signal sample values comprises respective time-multiplexed first and second component streams of digital-signal sample values in which the digital-signal sample values of said second component stream are interleaved with the digital-signal sample values of said first component stream; and said sequence of said respective first and second timing-control signals applied thereto during said successive cycles of operation of said filter is such as to independently operate on the digital-signal sample values of said first component stream and the digital-signal sample values of said first component stream during each of said successive cycles of operation of said filter.

* * * * *